US009012981B2

(12) United States Patent  (10) Patent No.: US 9,012,981 B2
Masuoka et al.  (45) Date of Patent: *Apr. 21, 2015

(54) SEMICONDUCTOR DEVICE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: Unisantis Electronics Singapore Pte. Ltd., Peninsula Plaza (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/100,456

(22) Filed: Dec. 9, 2013

(65) Prior Publication Data

US 2014/0091385 A1  Apr. 3, 2014

Related U.S. Application Data

(63) Continuation-in-part of application No. 13/891,584, filed on May 10, 2013, now Pat. No. 8,829,601.

(60) Provisional application No. 61/648,183, filed on May 17, 2012.

(51) Int. Cl.
*H01L 29/76* (2006.01)
*H01L 29/78* (2006.01)
(Continued)

(52) U.S. Cl.
CPC ...... *H01L 29/7827* (2013.01); *H01L 29/42392* (2013.01); *H01L 21/823885* (2013.01); *H01L 27/092* (2013.01); *H01L 21/823828* (2013.01)

(58) Field of Classification Search
CPC ............ H01L 29/7813; H01L 29/7802; H01L 29/7827; H01L 29/66666; H01L 29/0696

USPC .......................................... 257/329, 331, 338
See application file for complete search history.

(56) References Cited

U.S. PATENT DOCUMENTS 5,382,816 A  1/1995 Mitsui
6,300,198 B1  10/2001 Aeugle et al.
(Continued)

FOREIGN PATENT DOCUMENTS

CN  1251207  4/2000
JP  02-071556  3/1990
(Continued)

OTHER PUBLICATIONS

Notice of Allowance for U.S. Appl. No. 13/891,584 dated Jul. 3, 2014, 5 pages.
(Continued)

*Primary Examiner* — Quoc Hoang
(74) *Attorney, Agent, or Firm* — Brinks Gilson & Lione

(57) ABSTRACT

A semiconductor device includes a first pillar-shaped silicon layer formed on a planar silicon layer, a gate insulating film formed around the first pillar-shaped silicon layer, a first gate electrode formed around the gate insulating film, a gate line connected to the first gate electrode, a first first-conductivity-type diffusion layer formed in an upper portion of the first pillar-shaped silicon layer, a second first-conductivity-type diffusion layer formed in a lower portion of the first pillar-shaped silicon layer and an upper portion of the planar silicon layer, a first sidewall having a laminated structure of an insulating film and polysilicon and being formed on an upper sidewall of the first pillar-shaped silicon layer and an upper portion of the first gate electrode, and a first contact formed on the first first-conductivity-type diffusion layer and the first sidewall.

9 Claims, 43 Drawing Sheets

(51) Int. Cl.
*H01L 29/423* (2006.01)
*H01L 21/8238* (2006.01)
*H01L 27/092* (2006.01)

(56) References Cited

U.S. PATENT DOCUMENTS

| | | |
|---|---|---|
| 6,461,900 B1 | 10/2002 | Sundaresan et al. |
| 6,642,575 B1 | 11/2003 | Ono et al. |
| 6,747,314 B2 | 6/2004 | Sundaresan et al. |
| 7,115,476 B1 | 10/2006 | Izumida |
| 7,304,343 B2 | 12/2007 | Masuoka et al. |
| 7,348,243 B2 | 3/2008 | Kim |
| 7,442,976 B2 | 10/2008 | Juengling |
| 7,482,229 B2 | 1/2009 | Juengling |
| 7,683,428 B2 | 3/2010 | Chidambarrao et al. |
| 8,829,601 B2 * | 9/2014 | Masuoka et al. ............. 257/329 |
| 8,890,236 B1 | 11/2014 | Masuoka et al. |
| 2003/0075758 A1 | 4/2003 | Sundaresan et al. |
| 2005/0142771 A1 | 6/2005 | Kim |
| 2005/0224847 A1 | 10/2005 | Masuoka et al. |
| 2006/0046407 A1 | 3/2006 | Juengling |
| 2006/0258109 A1 | 11/2006 | Juengling |
| 2008/0061370 A1 | 3/2008 | Matsuo |
| 2009/0042347 A1 | 2/2009 | Oyu |
| 2009/0078993 A1 | 3/2009 | Fujimoto |
| 2009/0096000 A1 | 4/2009 | Juengling |
| 2009/0200604 A1 | 8/2009 | Chidambarrao et al. |
| 2013/0307057 A1 | 11/2013 | Masuoka et al. |
| 2014/0091385 A1 | 4/2014 | Masuoka et al. |

FOREIGN PATENT DOCUMENTS

| | | |
|---|---|---|
| JP | 02-145761 | 6/1990 |
| JP | 02-188966 | 7/1990 |
| JP | 03-145761 | 6/1991 |
| JP | 06-021389 | 1/1994 |
| JP | 06-021467 | 1/1994 |
| JP | 07-245291 | 9/1995 |
| JP | 07-263677 | 10/1995 |
| JP | 08-227997 | 9/1996 |
| JP | 11-297984 | 10/1999 |
| JP | 2001-284598 | 10/2001 |
| JP | 2003-179160 | 6/2003 |
| JP | 2005-197704 | 7/2005 |
| JP | 2006-108514 | 4/2006 |
| JP | 2006-310651 | 11/2006 |
| JP | 2006-351745 | 12/2006 |
| JP | 2007-520883 | 7/2007 |
| JP | 2007-329480 | 12/2007 |
| JP | 2008-511997 | 4/2008 |
| JP | 2008-177565 | 7/2008 |
| JP | 2009-081163 | 4/2009 |
| JP | 2009-182317 | 8/2009 |
| JP | 2010-251586 | 11/2010 |
| JP | 2010-251678 | 11/2010 |
| JP | 2010-258345 | 11/2010 |
| JP | 2011-258780 | 12/2011 |
| JP | 2012-004244 | 1/2012 |
| WO | WO 2005/079182 | 9/2005 |
| WO | WO 2006/028777 | 3/2006 |

OTHER PUBLICATIONS

Office Action for U.S. Appl. No. 14/449,570 dated Sep. 10, 2014, 6 pages.
Notice of Allowance for U.S. Appl. No. 14/449,570 dated Sep. 26, 2014, 5 pages.
Extended European Search Report for European Application No. 10003947.8, dated Nov. 17, 2010, 9 pages.
Mistry et al., "A 45nm Logic Technology with High-k+Metal Gate Transistors, Strained Silicon, 9 Cu Interconnect Layers, 193nm Dry Patterning, and 100% Pb-free Packaging", *IEEE*, pp. 247-250, 2007.
Office Action from counterpart Chinese Application No. 201010167317.6, dated Nov. 24, 2011, 12 pages.
Wu et al., "High Performance 22/20nm FinFET CMOS Devices with Advanced High-K/Metal Gate Scheme", *IEEE*, pp. 27.1.1-27.1.4, 2010.
Office Action for U.S. Appl. No. 13/289,742, dated Dec. 5, 2012, 13 pages.
Search Report and Written Opinion for Singapore Patent Application Serial No. 201108125-4, dated Oct. 5, 2012, 12 pages.
International Search Report for PCT/JP2012/062597, dated Aug. 21, 2012, 5 pages.
International Search Report for PCT/JP2012/062857, dated Aug. 21, 2012, 5 pages.
Office Action for U.S. Appl. No. 14/513,460 dated Jan. 27, 2015, 6 pages.

* cited by examiner

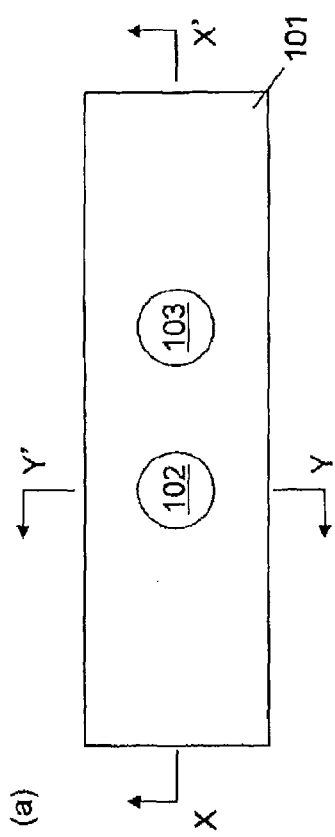
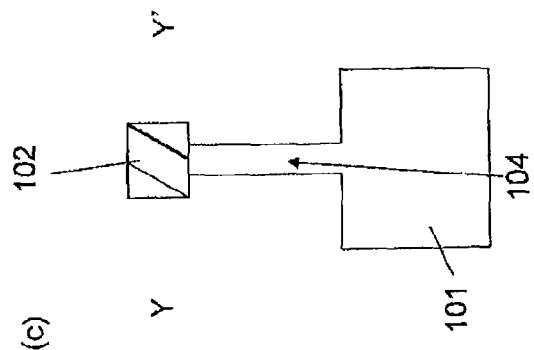
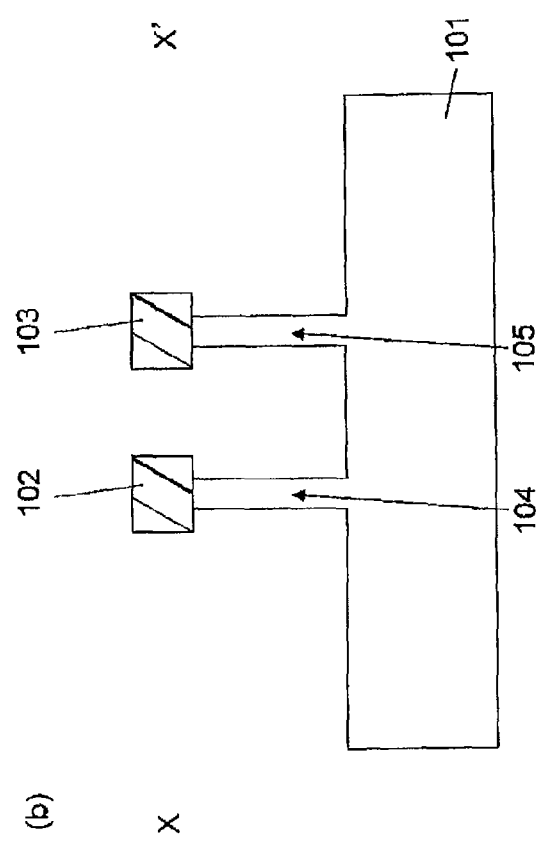
Fig. 3

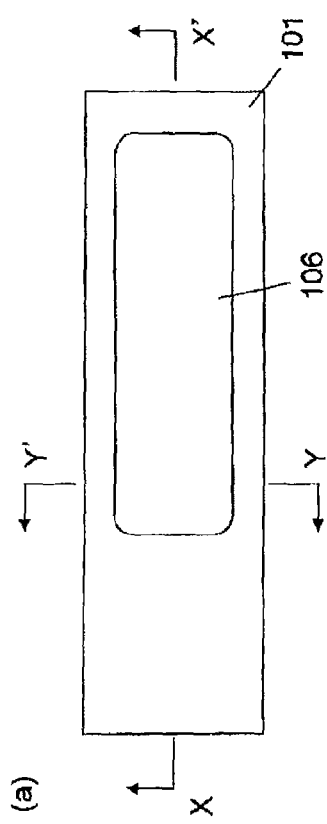
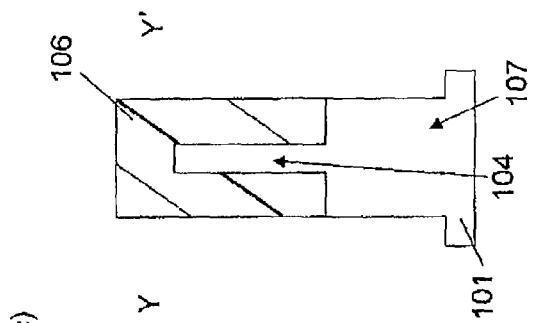
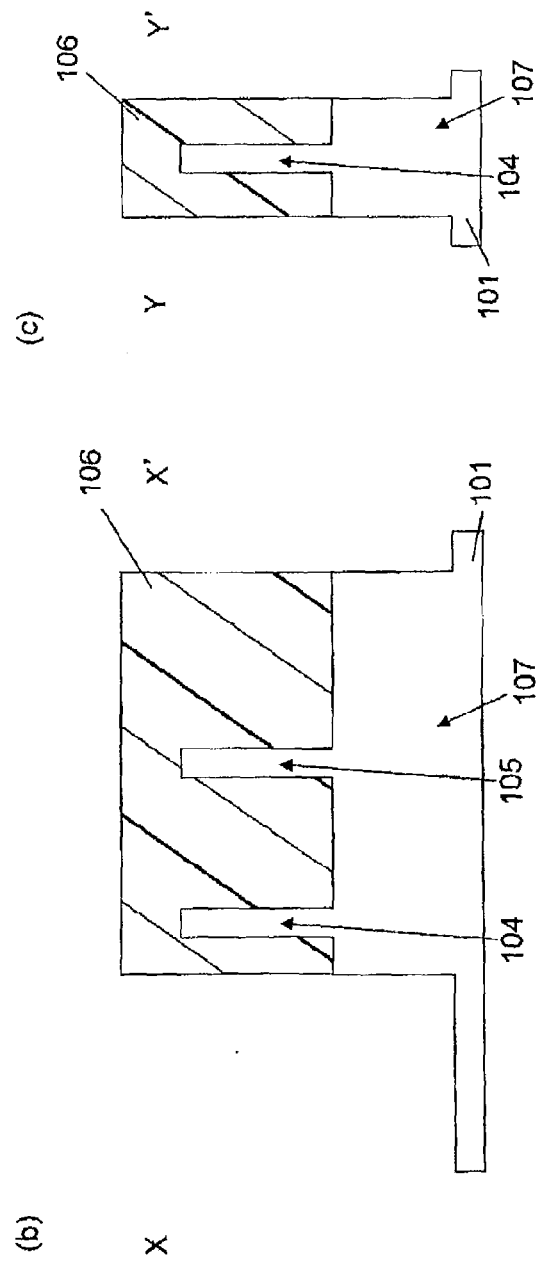
Fig.6

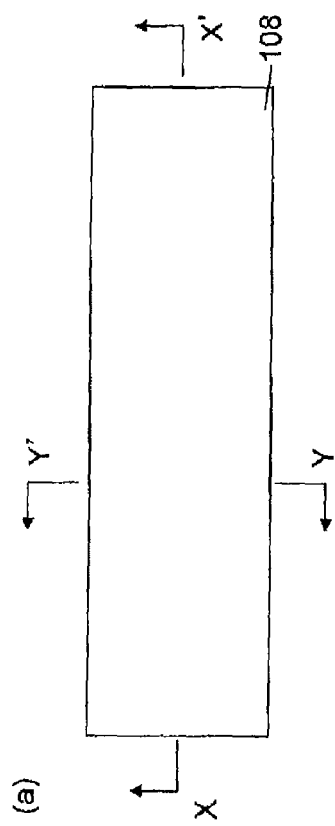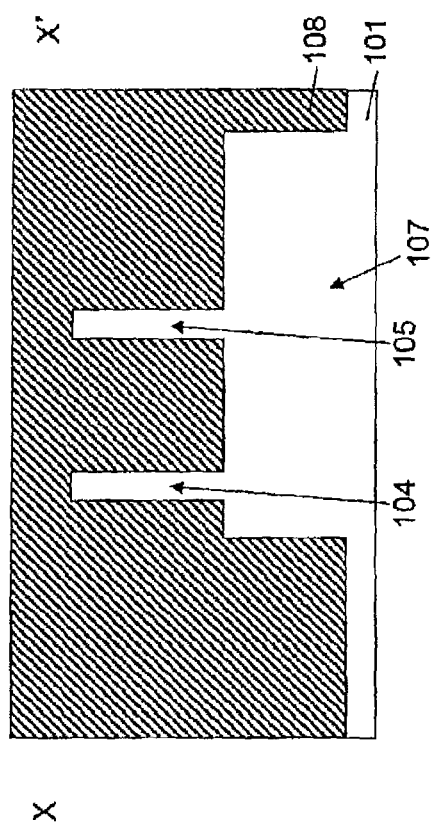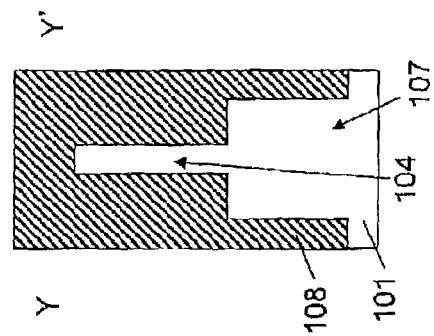
Fig. 8

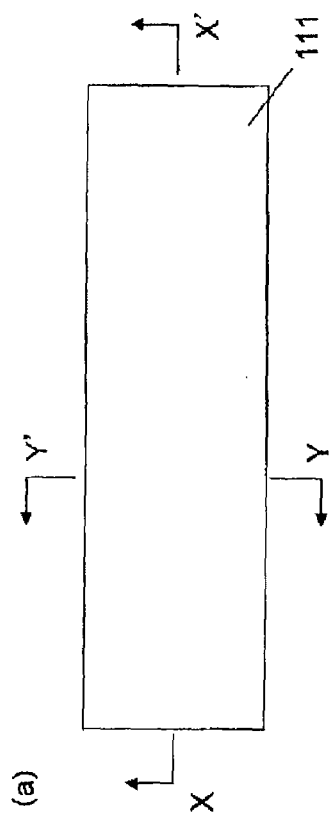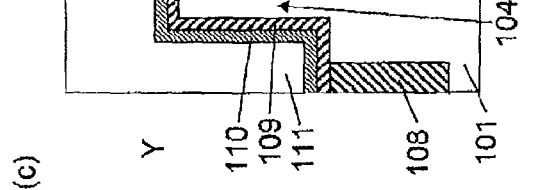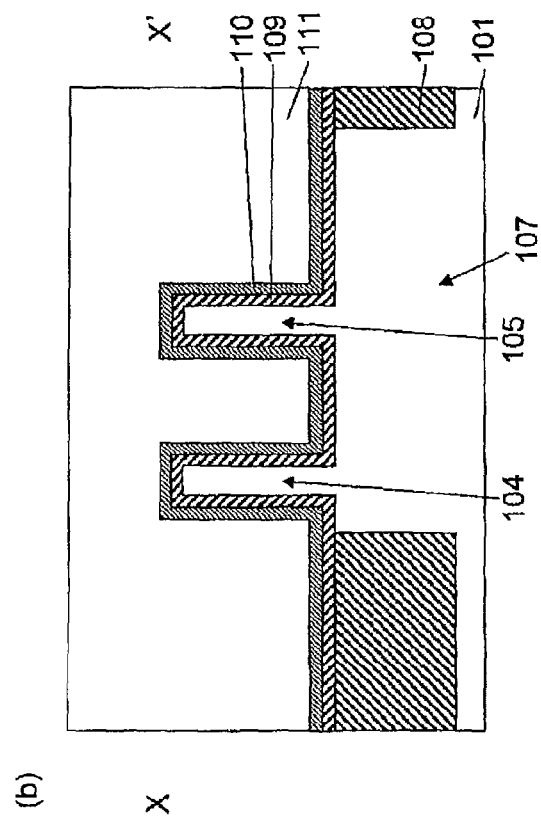
Fig. 12

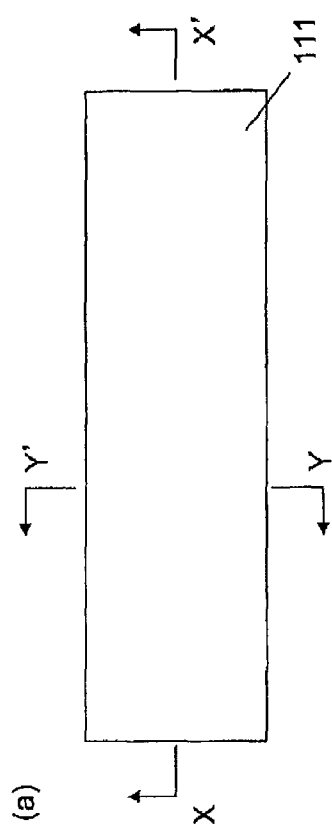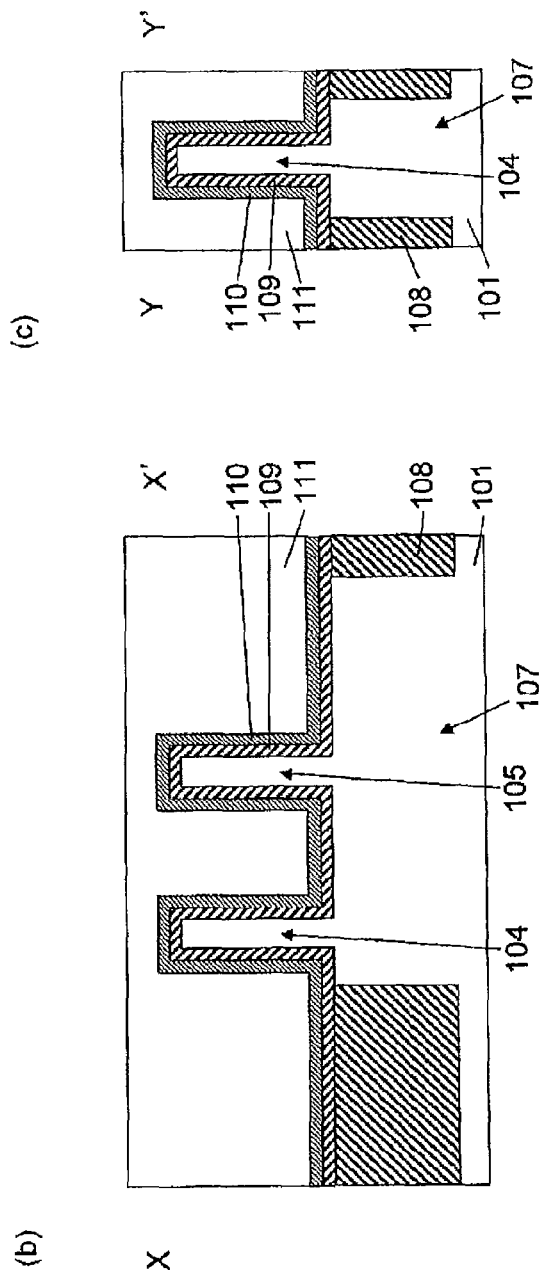
Fig.13

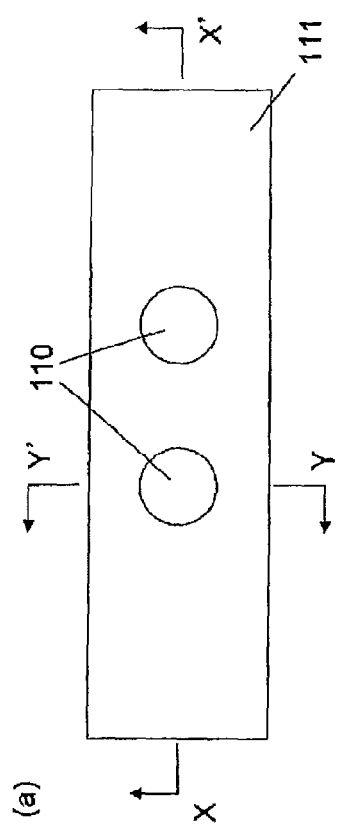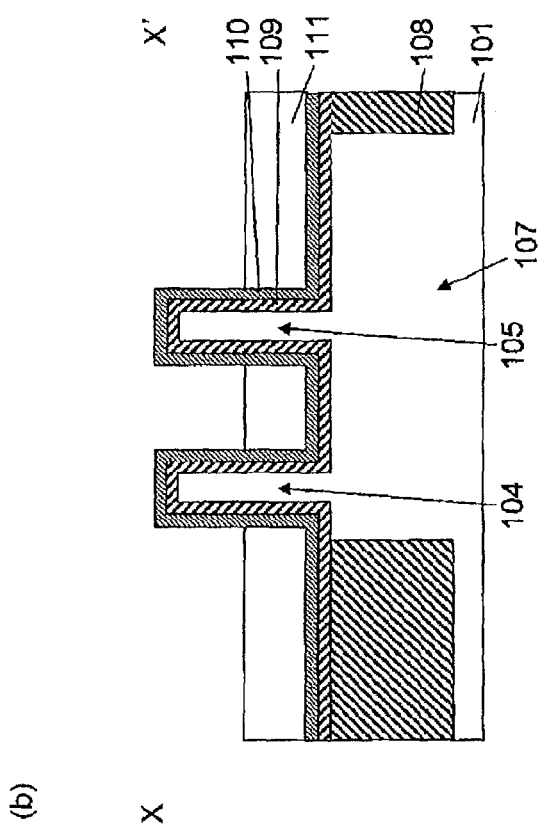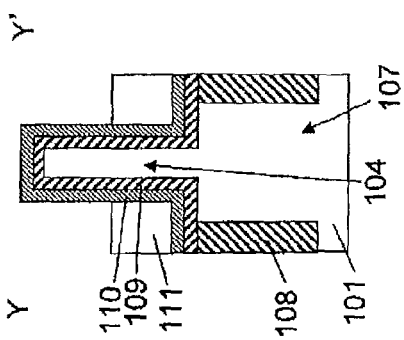
Fig.14

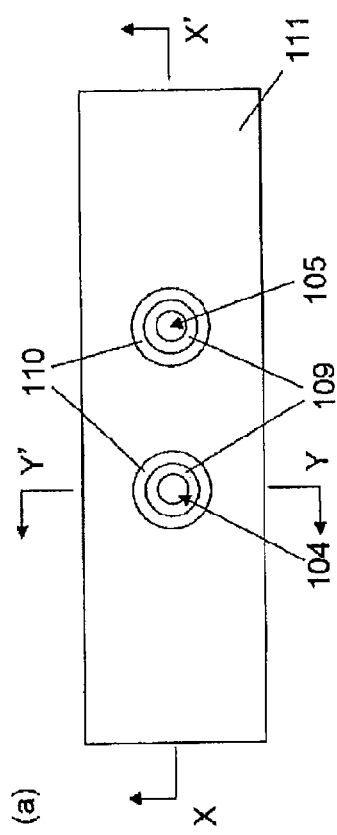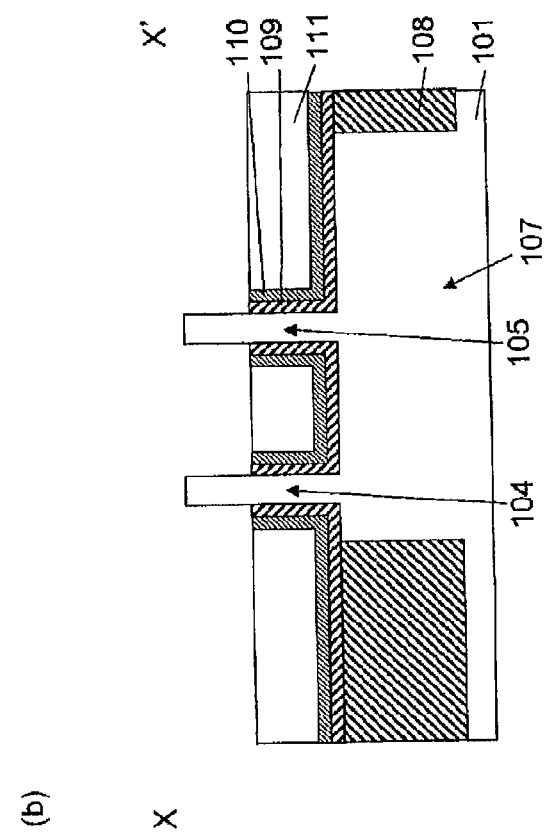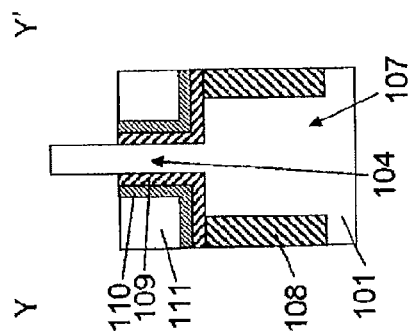
Fig.15

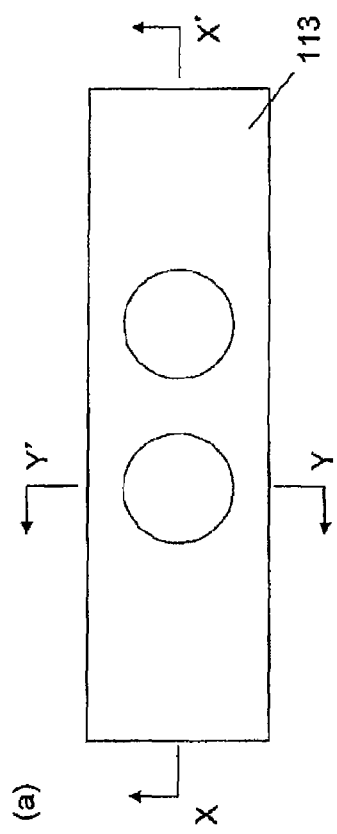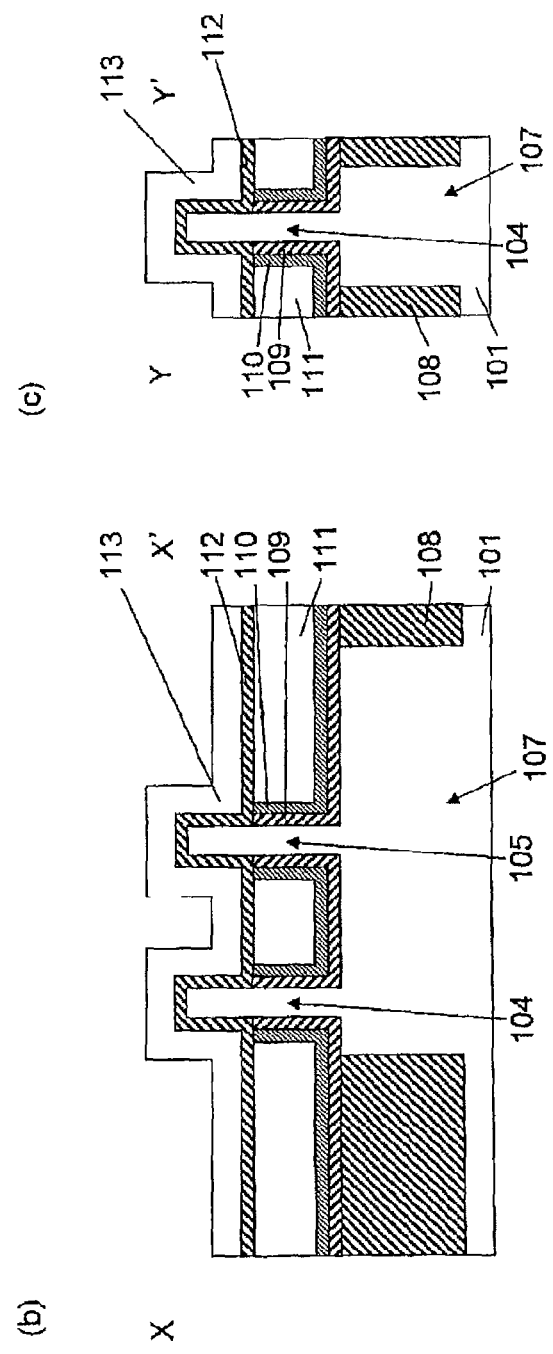
Fig.16

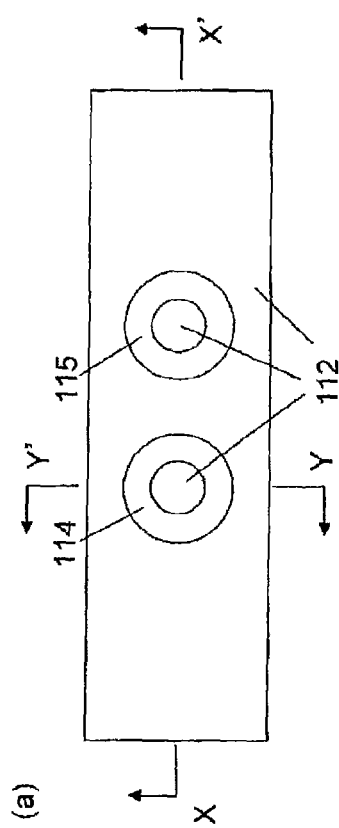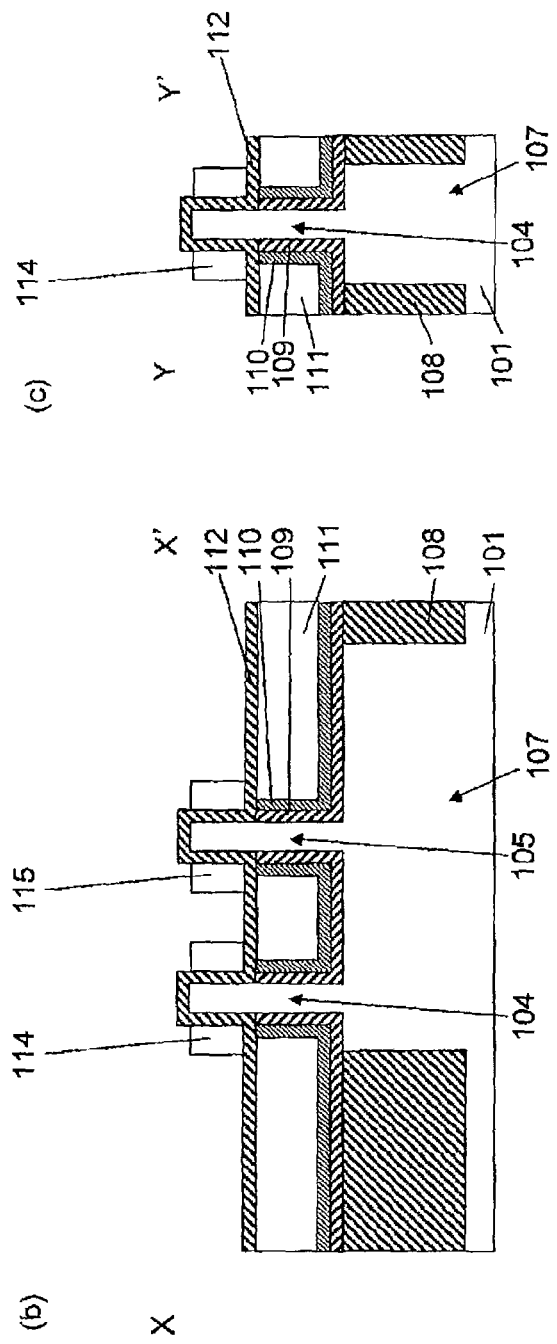
Fig.17

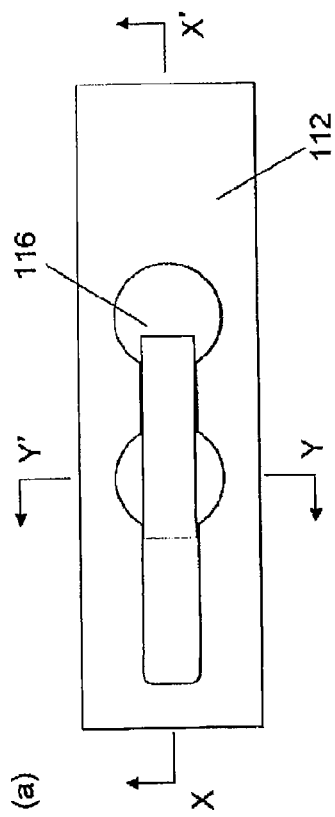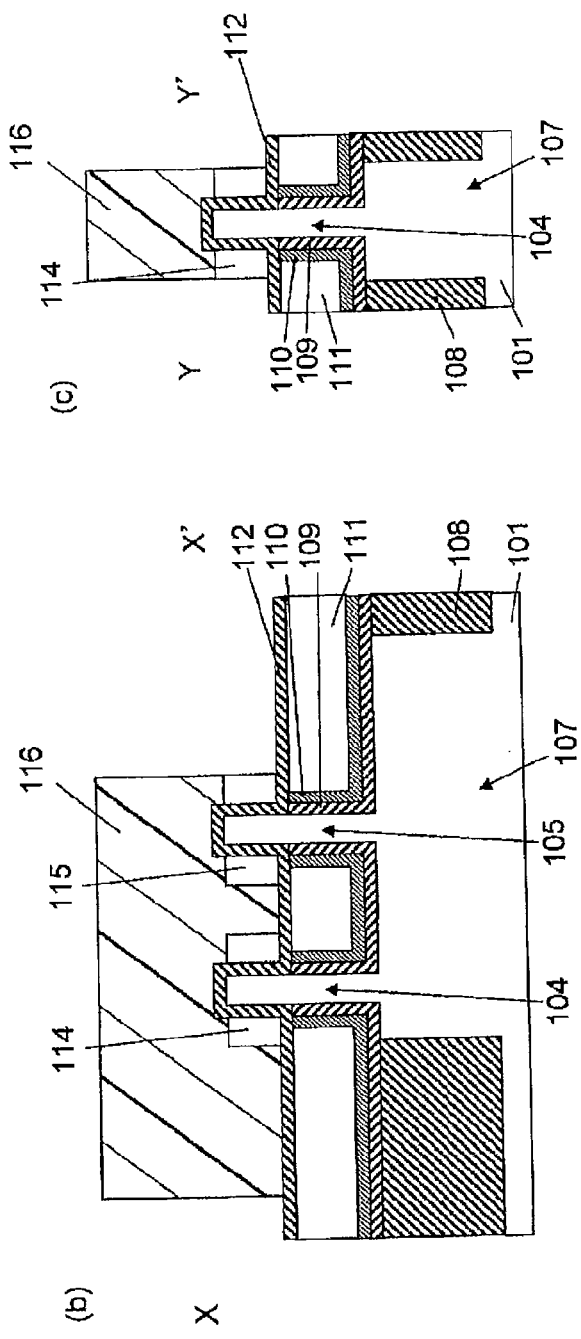
Fig.18

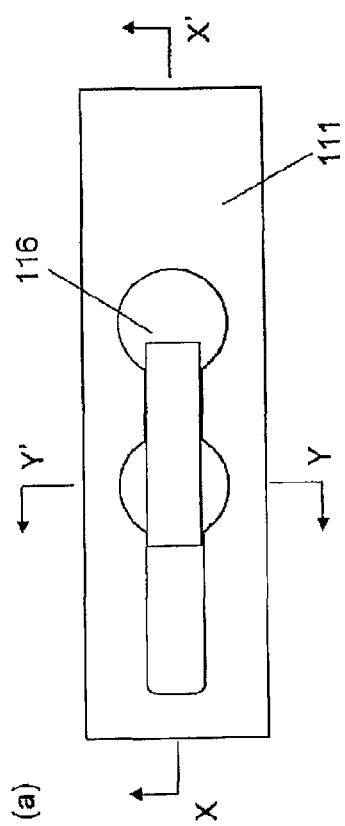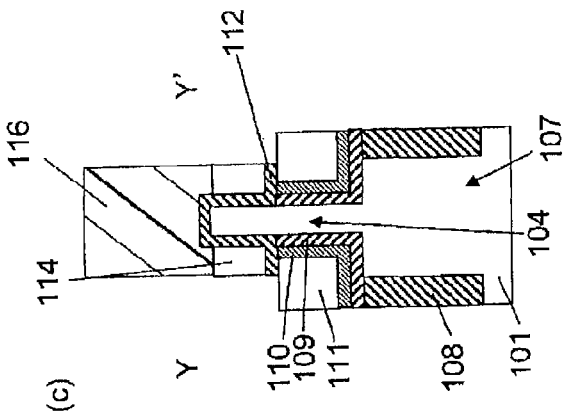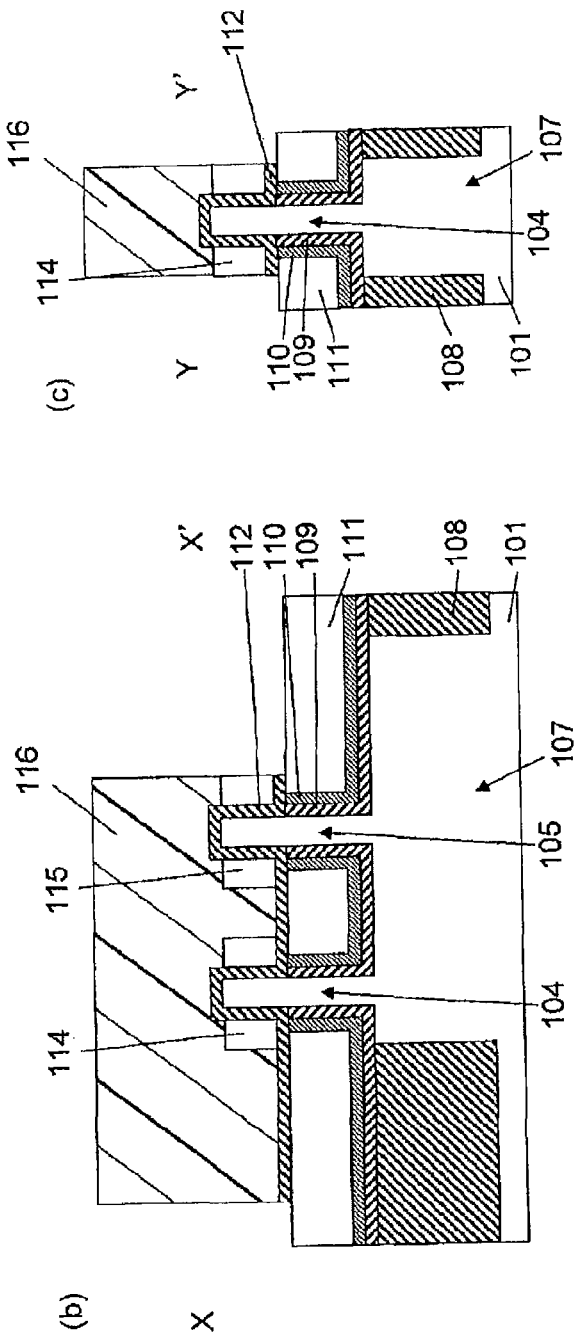
Fig.19

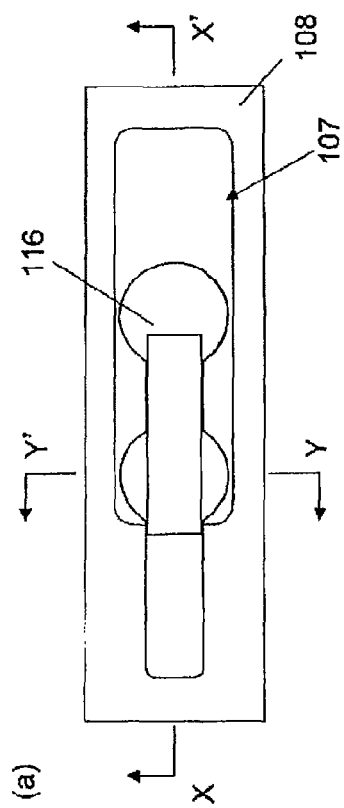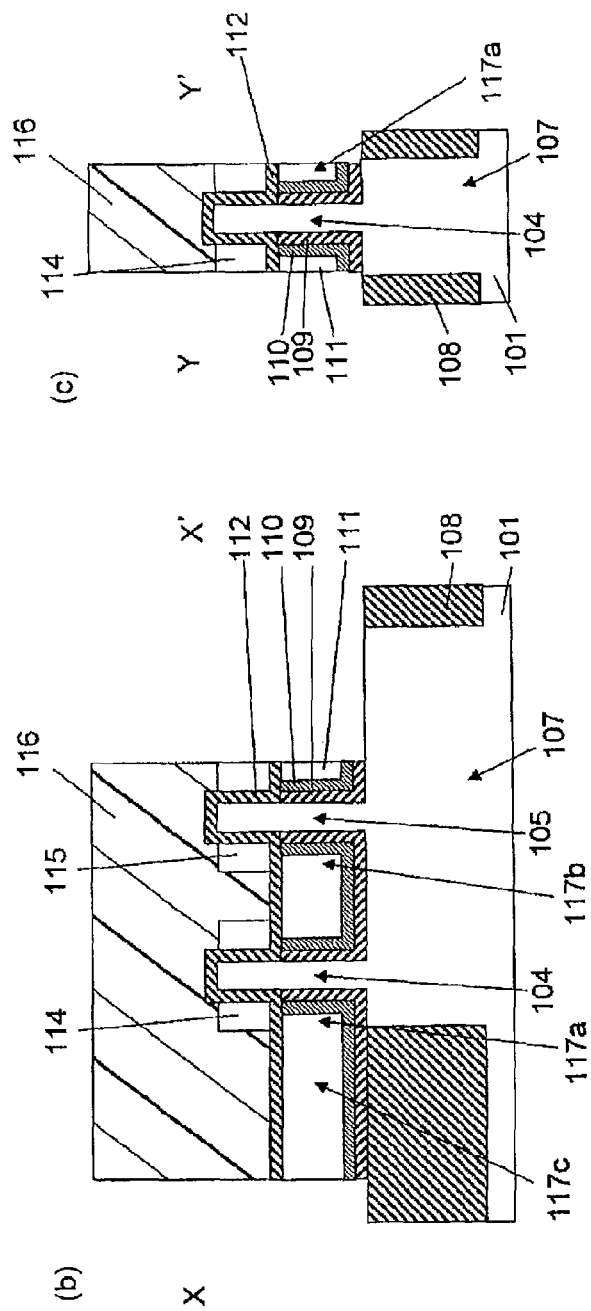
Fig.20

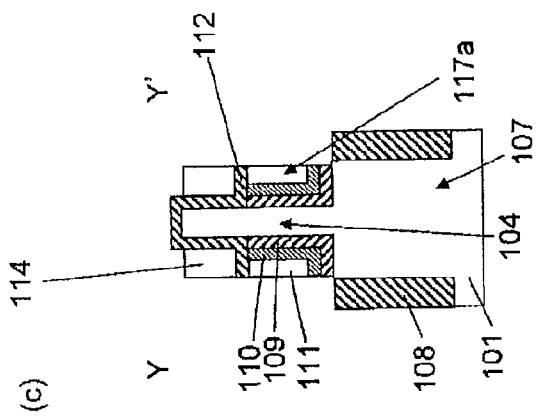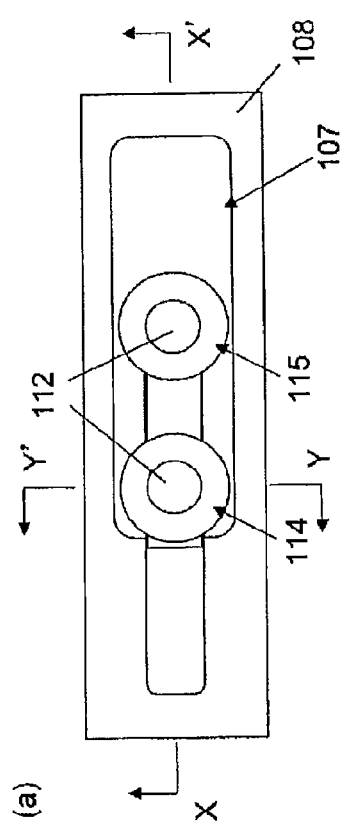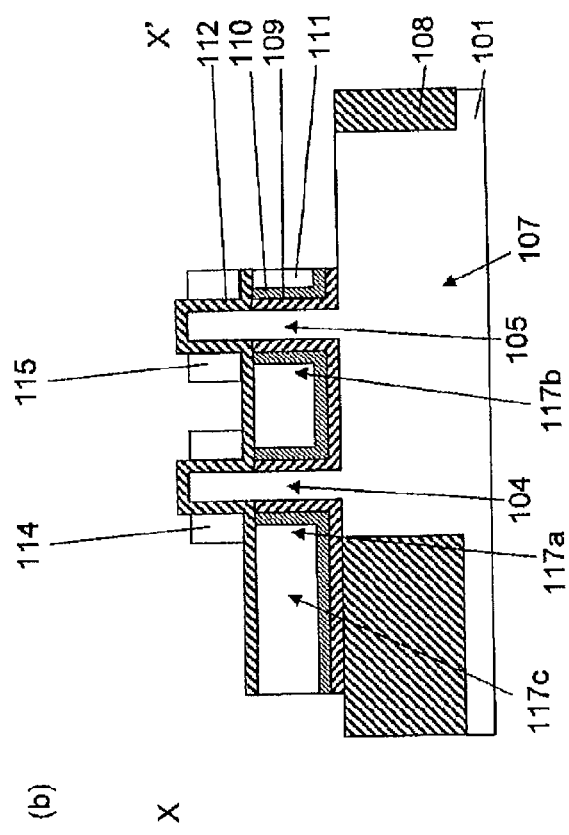
Fig. 21

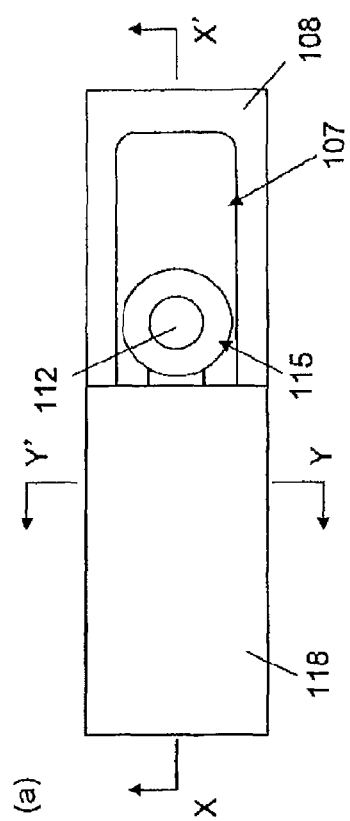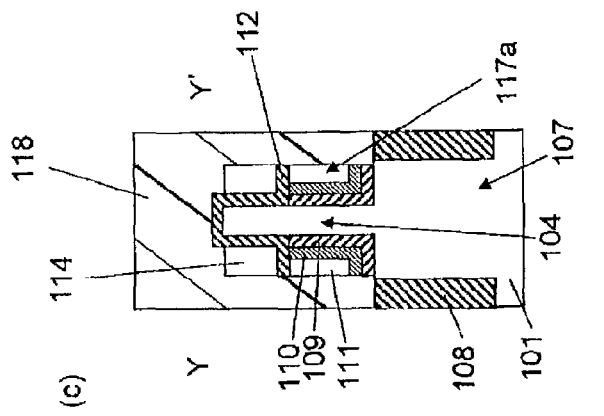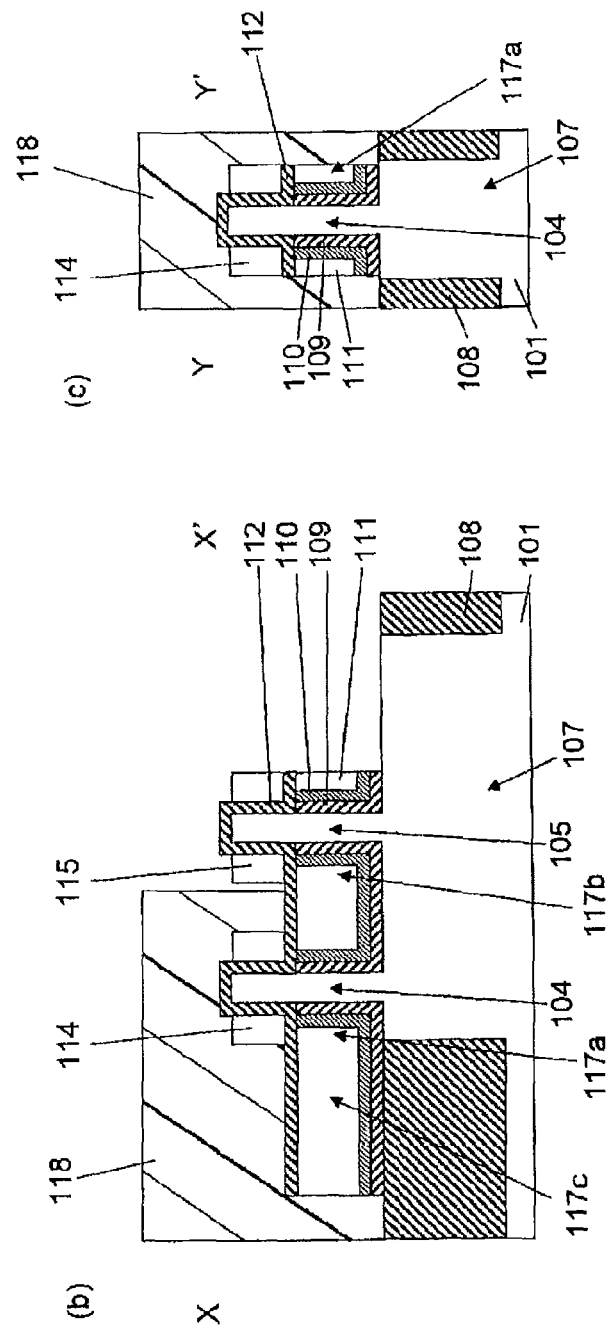
Fig.22

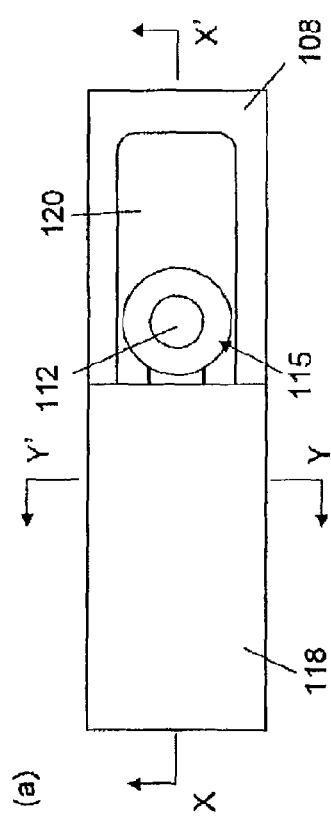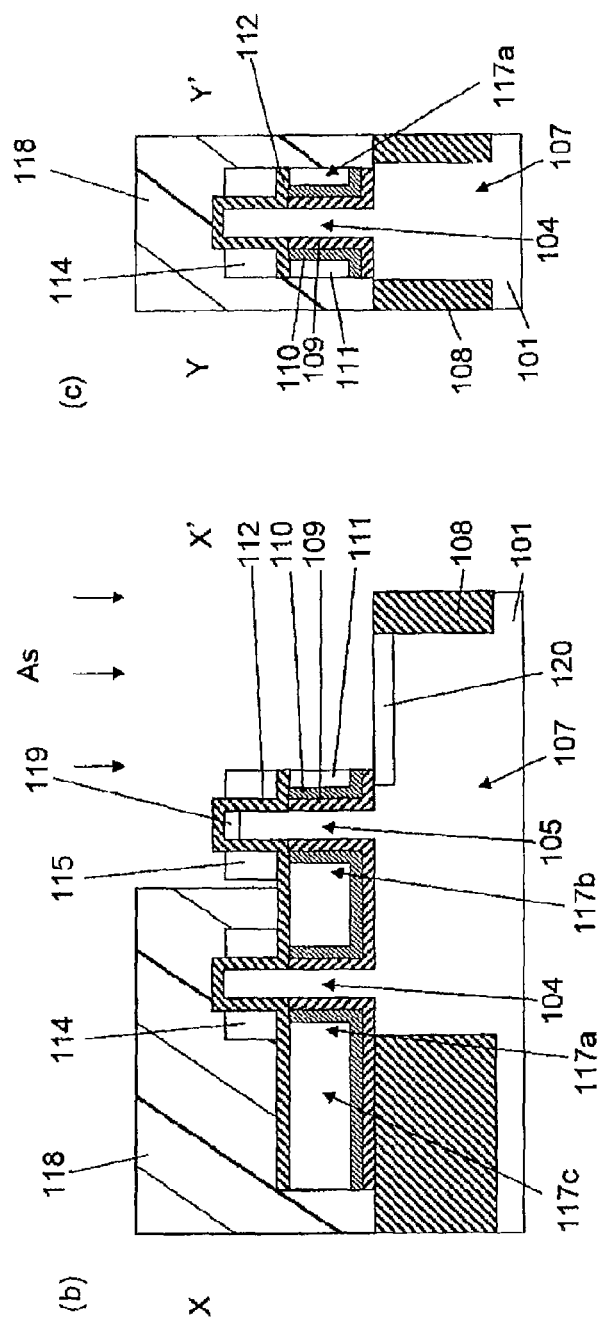
Fig.23

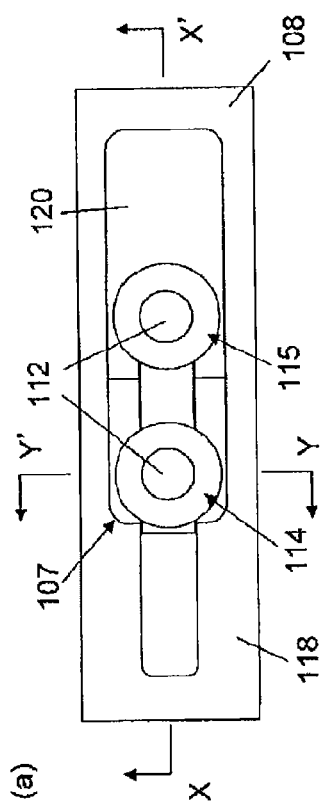
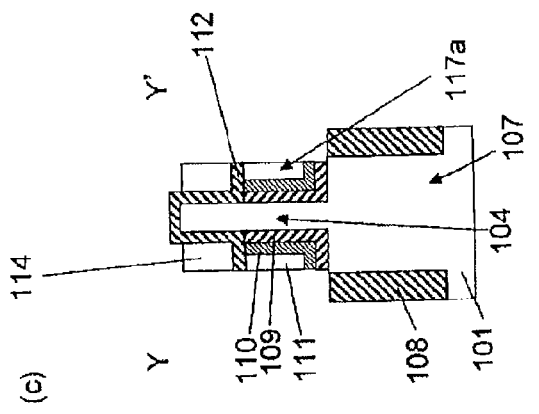
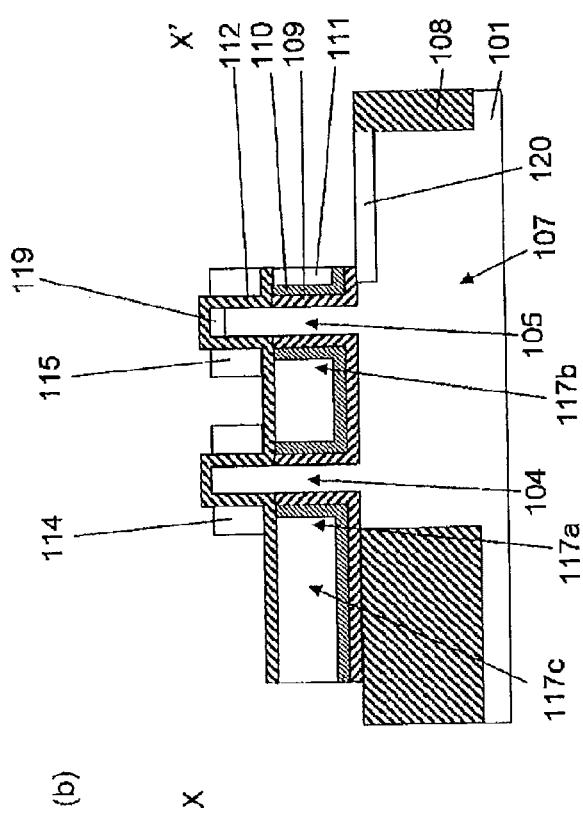
Fig.24

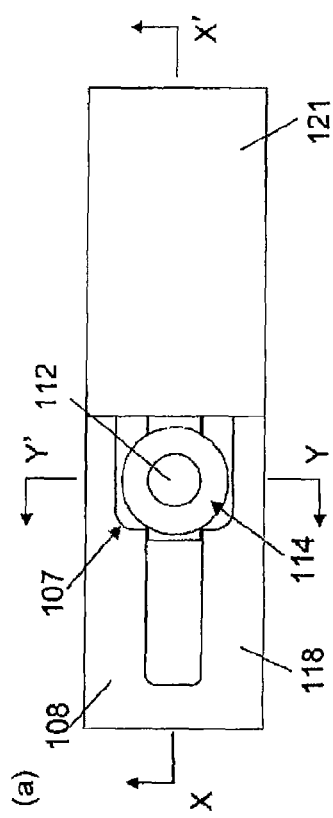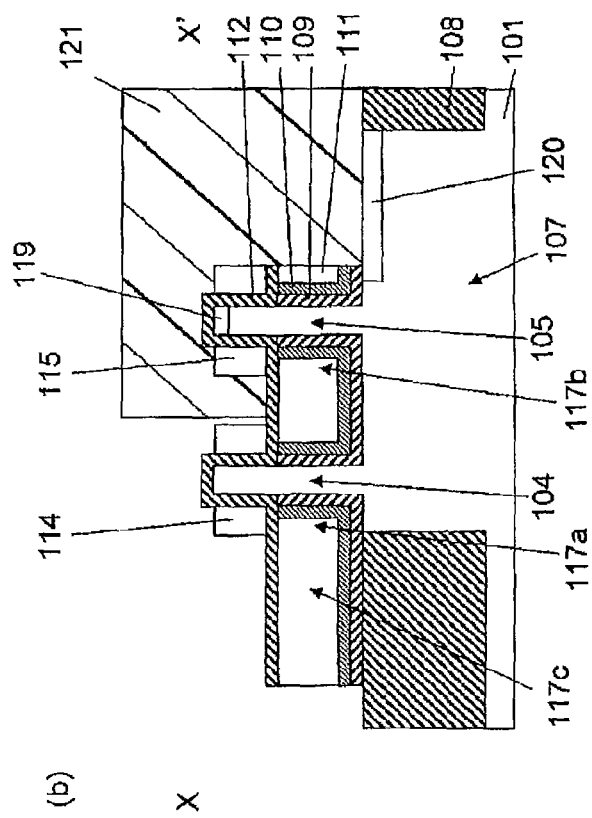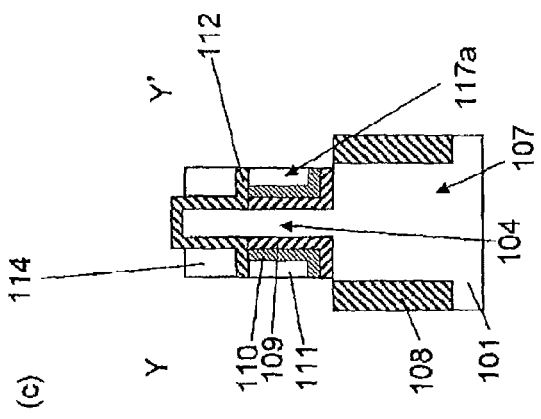
Fig.25

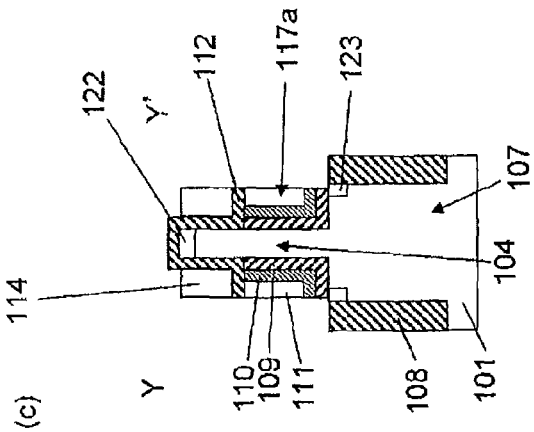
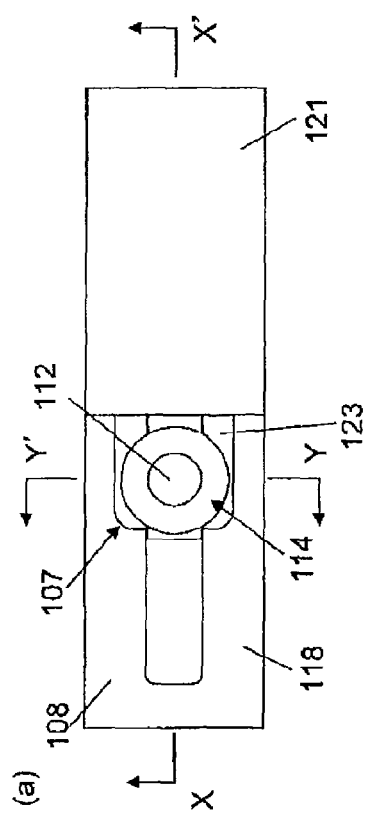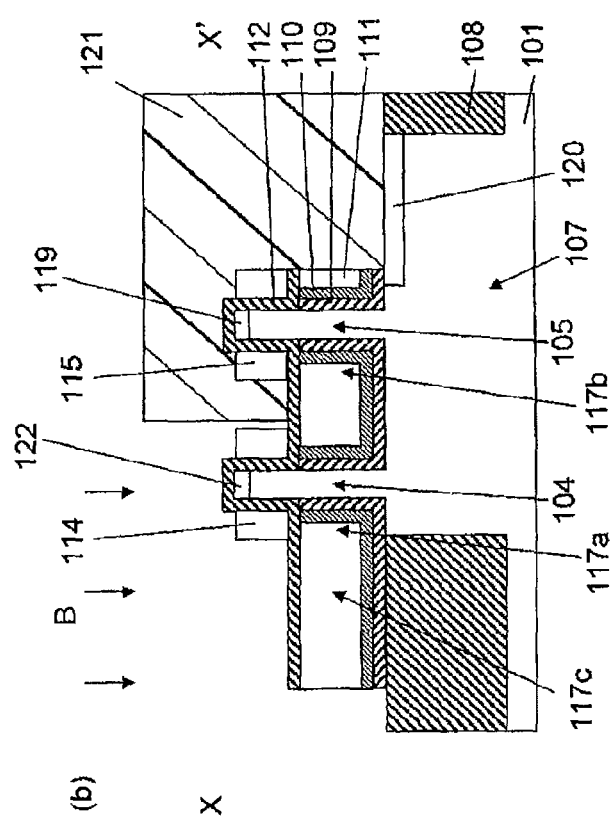
Fig.26

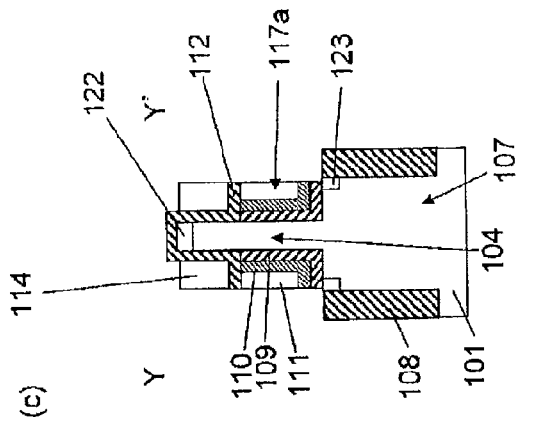
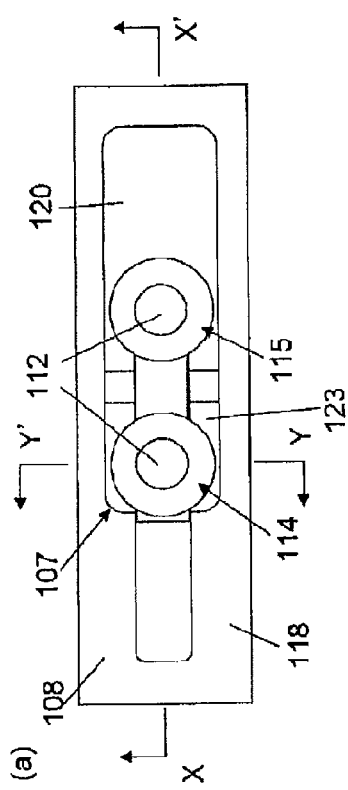
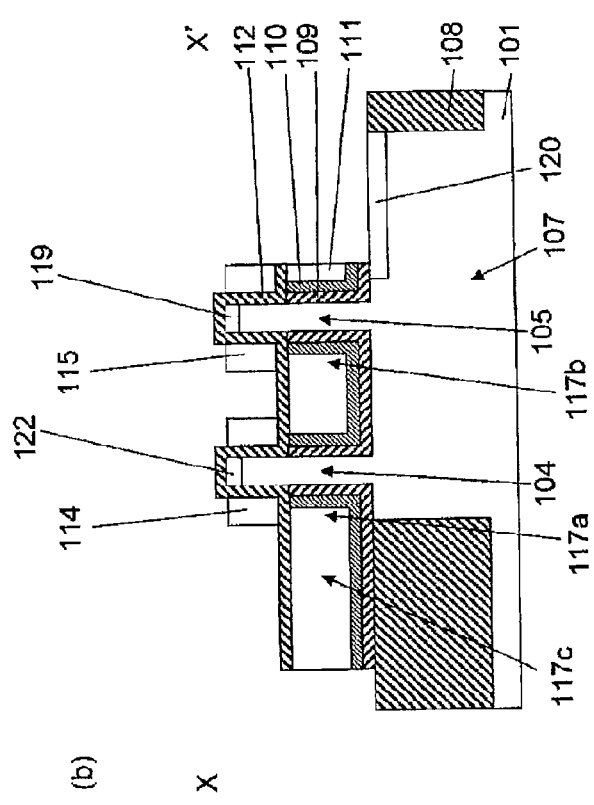
Fig. 27

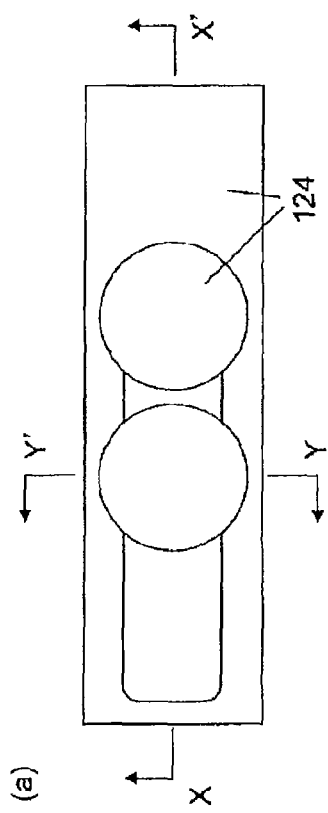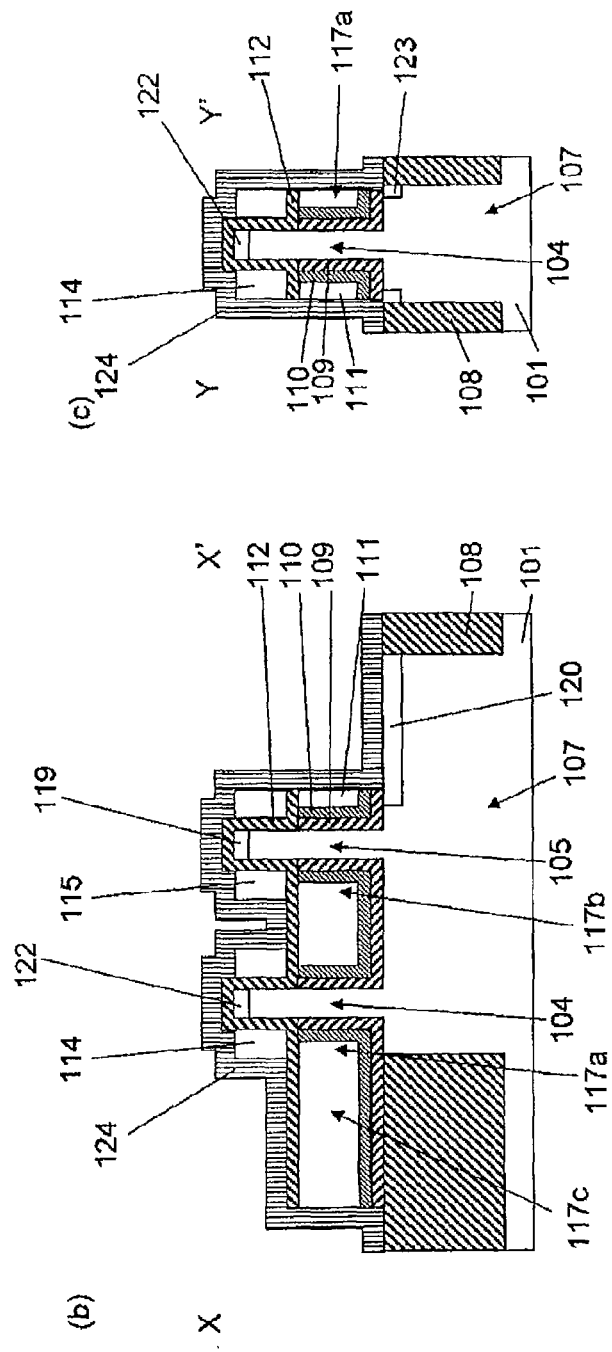
Fig.28

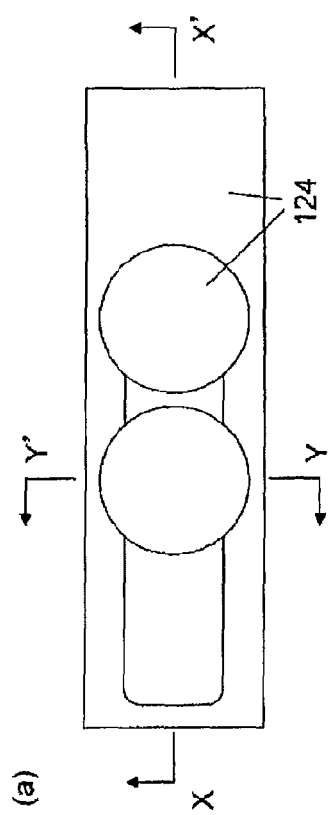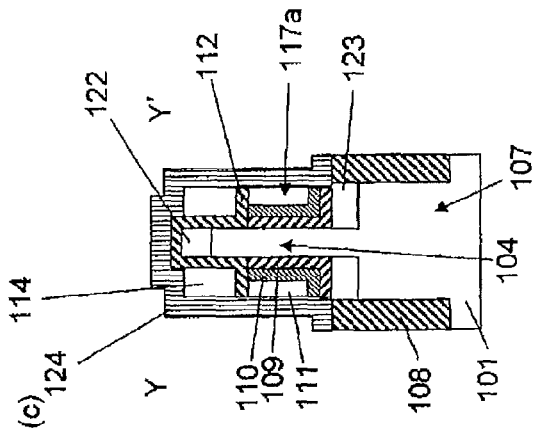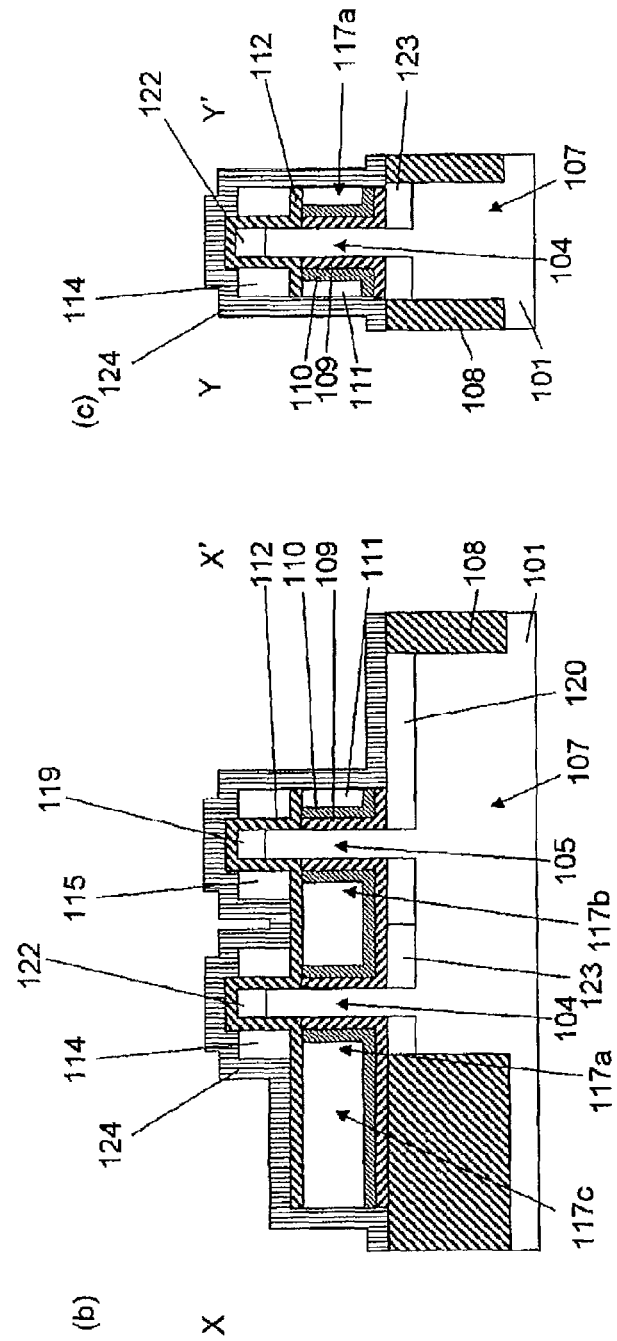
Fig.29

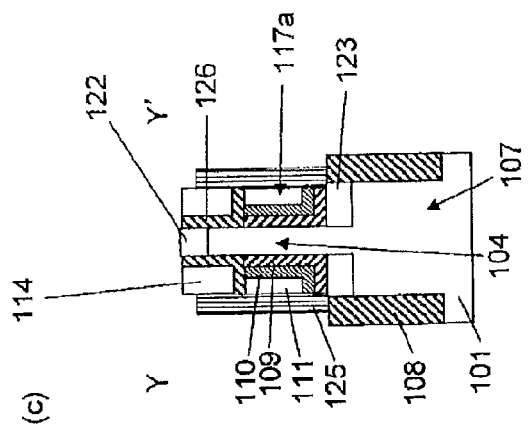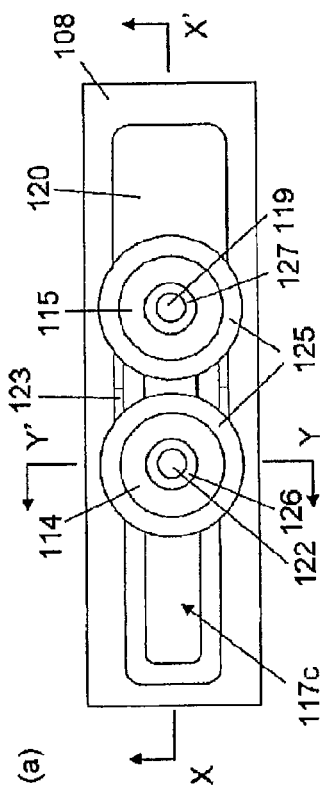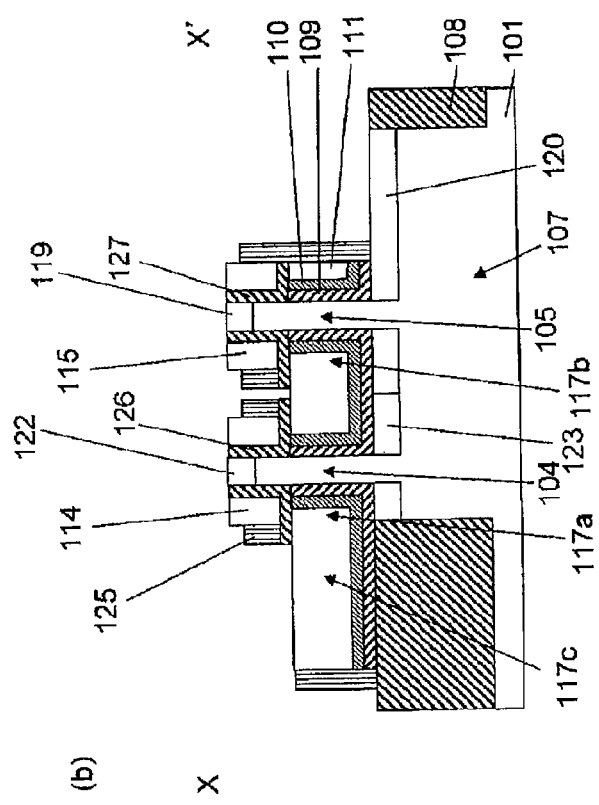
Fig. 30

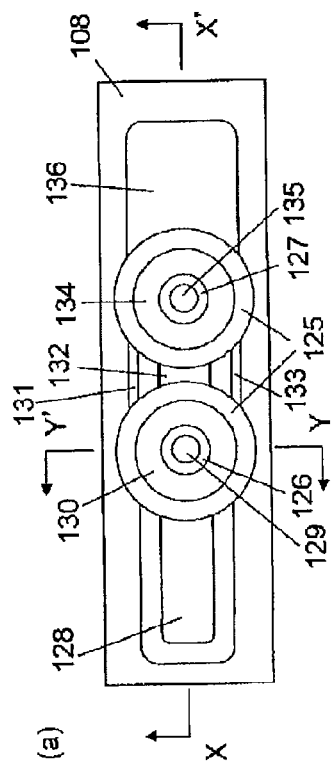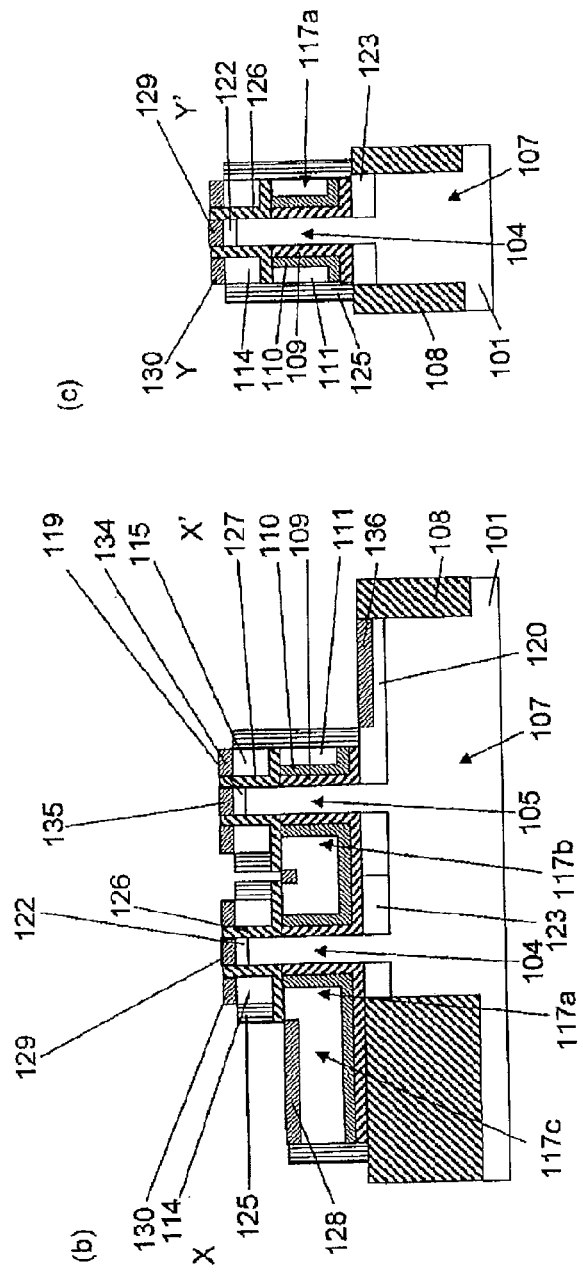
Fig.31

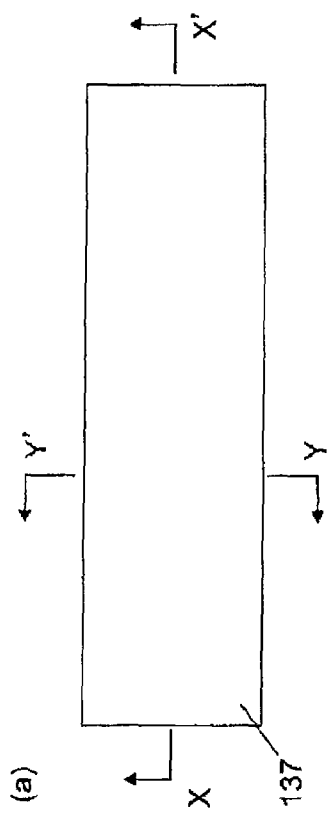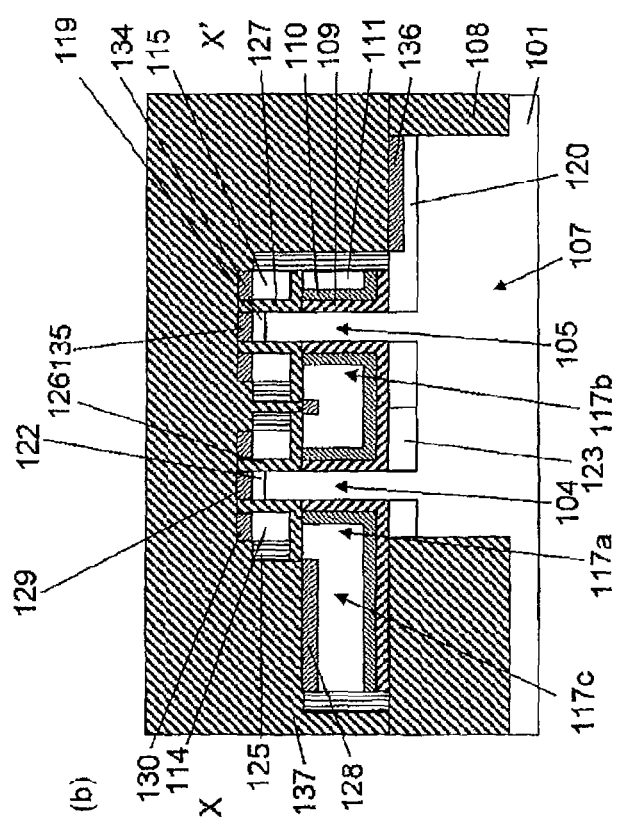
Fig.32

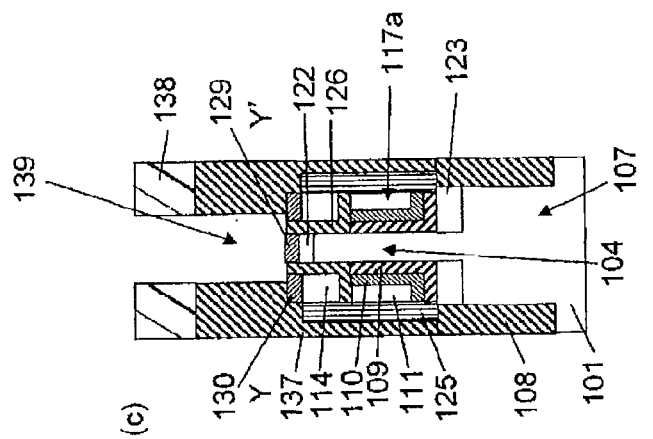
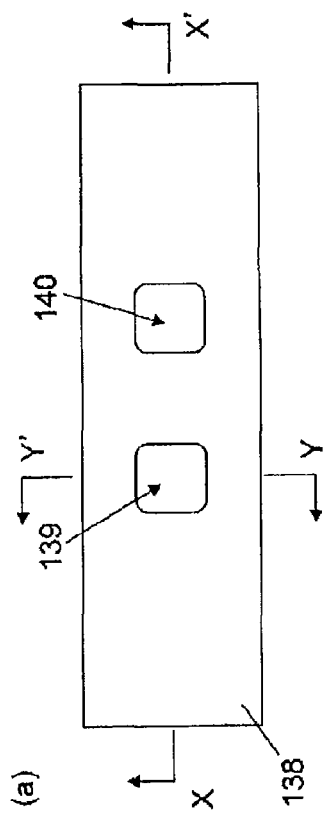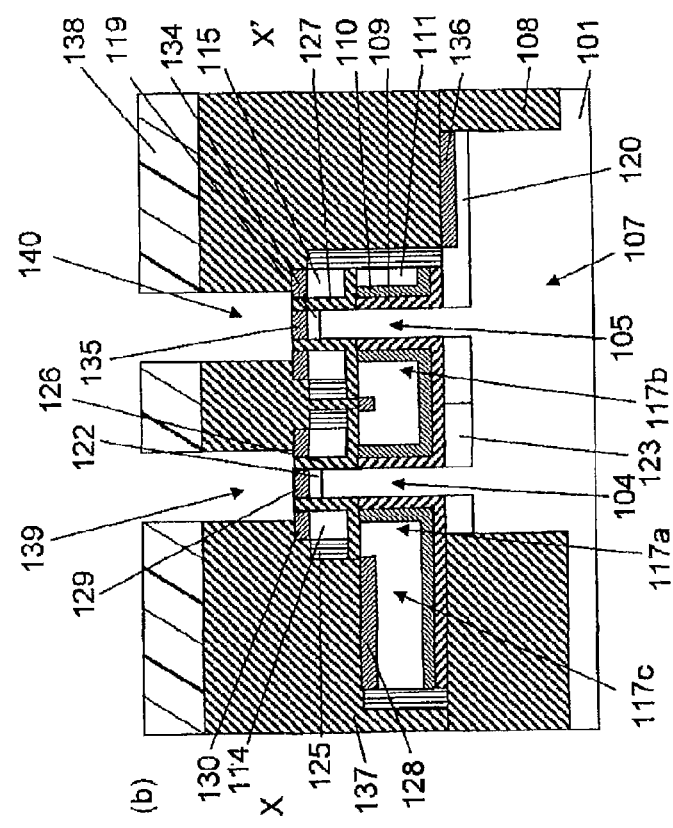
Fig.34

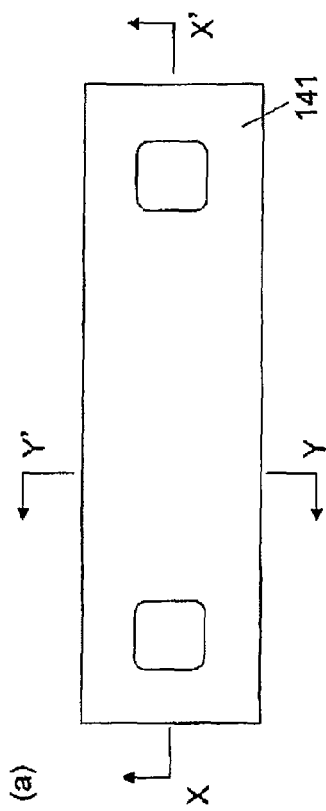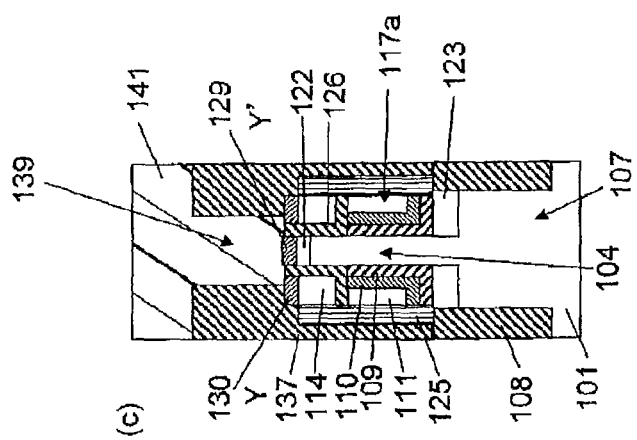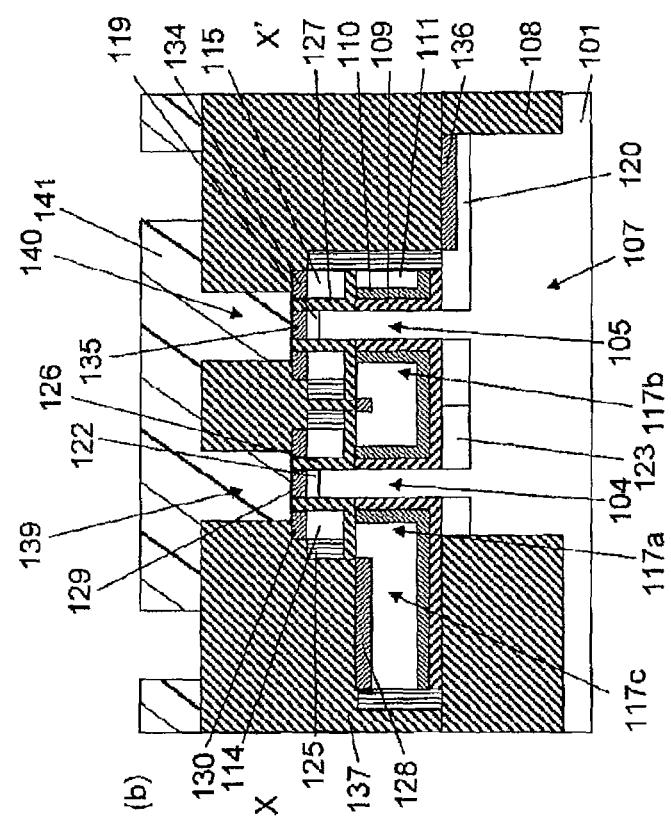
Fig. 36

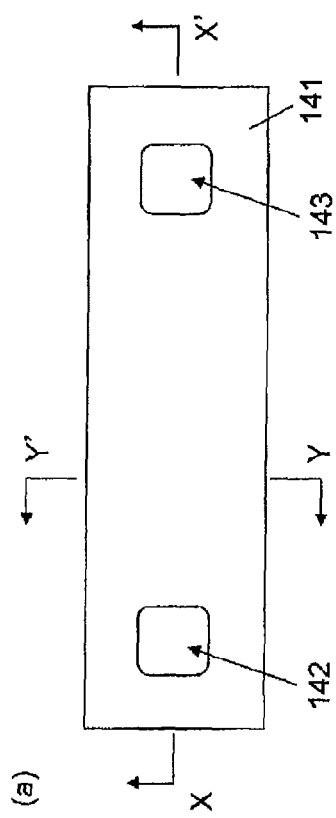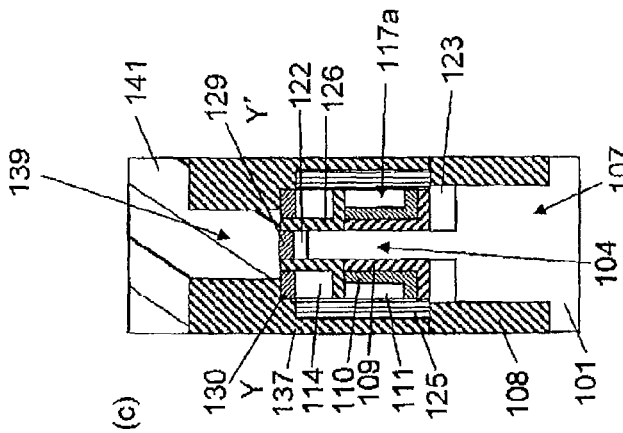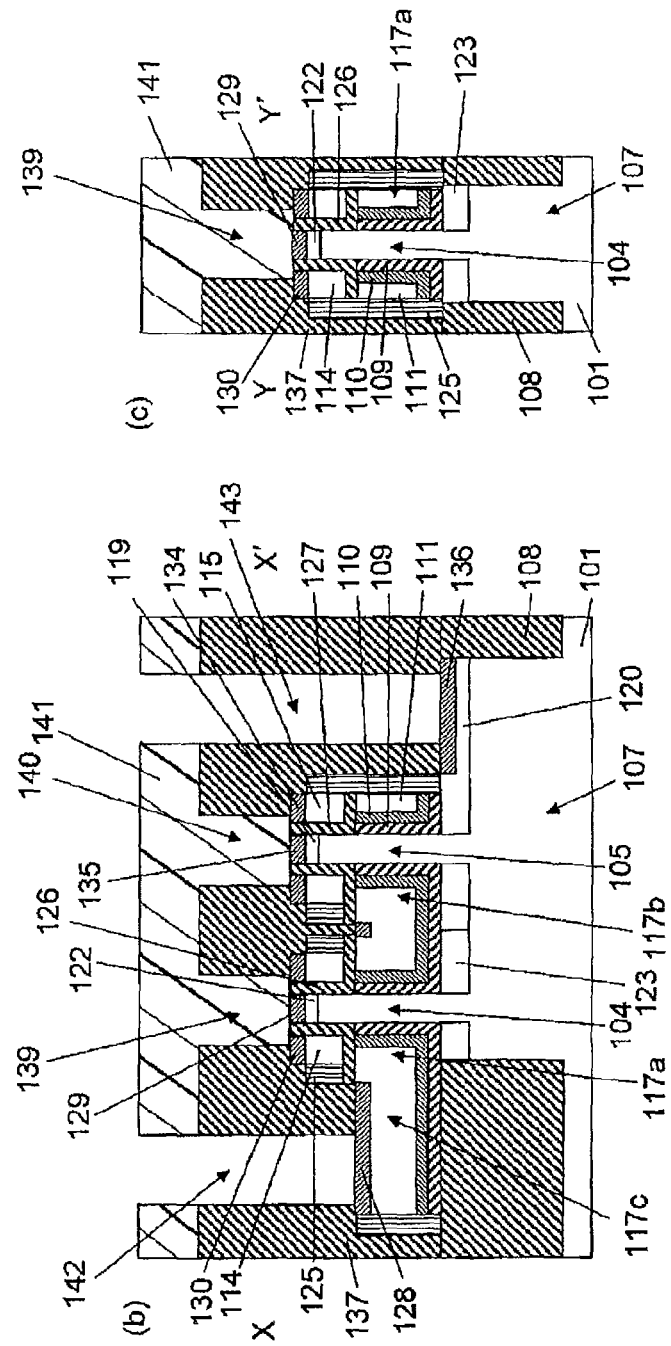
Fig.37

SEMICONDUCTOR DEVICE

RELATED APPLICATIONS

This application is a continuation-in-part of U.S. application Ser. No. 13/891,584, filed May 10, 2013, which claims the benefit of the filing date of U.S. Provisional Patent Appl. Ser. No. 61/648,183 filed May 17, 2012. The entire contents of which are hereby incorporated by reference.

BACKGROUND OF THE INVENTION

1. Technical Field

The present invention relates to a semiconductor device.

2. Description of the Related Art

Semiconductor integrated circuits, particularly integrated circuits using MOS transistors, are increasing in integration. With increases in integration, MOS transistors used in the integrated circuits increasingly become finer up to a nano-level. Such finer MOS transistors have difficulty in suppressing leak currents and difficulty in decreasing areas occupied by circuits in view of the demand for securing necessary amounts of currents. In order to resolve the problem, there are proposed surrounding gate transistors (referred to as "SGT" hereinafter) having a structure in which a source, gate, and drain are disposed perpendicularly to a substrate, and a gate electrode surrounds a pillar-shaped semiconductor layer (for example, refer to Japanese Unexamined Patent Application Publication Nos. 2-715562, 2-188966, and 3-145761).

A conventional SGT manufacturing method includes forming a silicon pillar having a pillar-shaped nitride film hard mask formed thereon, forming a diffusion layer in a lower portion of the silicon pillar, depositing a gate material, planarizing the gate material, etching back the gate material, and forming an insulating film sidewall on sidewalls of the silicon pillar and the nitride film hard mask. Then, a resist pattern for a gate line is formed, the gate material is etched, the nitride film hard mask is removed, and a diffusion layer is formed in an upper portion of the silicon pillar (for example, refer to Japanese Unexamined Patent Application Publication No. 2009-182317). Then, a nitride film sidewall is formed on the sidewall of the silicon pillar, a diffusion layer is formed in an upper portion of the silicon pillar by ion implantation, a nitride film is formed as a contact stopper, an oxide film is formed as an interlayer film, and then contact etching is performed.

It is known that oxide film etching for forming a contact has a high selection ratio to a nitride film in a flat portion, but the selection ratio in a nitride film shoulder portion is lower than that in the flat portion.

Since the diameter of a silicon pillar of SGT decreases with reduction in size, a flat area is decreased. In addition, a nitride film sidewall corresponds to a nitride film shoulder portion, and thus the selection ratio of etching an oxide film is decreased. Therefore, etching an oxide film to form a contact on a silicon pillar is not stopped by a nitride film to form a contact hole which reaches a gate, resulting in short-circuiting between the silicon pillar and the gate.

There is proposed a structure for preventing the occurrence of short-circuiting between a contact and a gate by forming an epitaxial semiconductor layer on a silicon pillar of SGT (refer to, for example, Japanese Unexamined Patent Application Publication No. 2010-258345). However, epitaxial growth requires insulating film sidewalls to be formed on an upper sidewall of the silicon pillar and on an upper portion of a gate electrode. When polysilicon is used in a gate, silicon is also grown on the gate. Therefore, epitaxial growth to a height equal to or higher than the height of the insulating film sidewall causes short-circuiting between the gate and an upper portion of the silicon pillar.

On the other hand, the nitride film sidewall is formed on the sidewall of the silicon pillar, and the diffusion layer is formed in an upper portion of the silicon pillar by ion implantation. Therefore, ions are implanted from above into an upper portion of the silicon pillar, and thus a deep diffusion layer is required to be formed. When a deep diffusion layer is formed, the diffusion layer is also widened in the lateral direction. That is, higher integration becomes difficult to achieve.

In addition, when the silicon pillar becomes thin, it is difficult to allow impurities to present in the silicon pillar because the silicon density is $5 \times 10^{22}/\text{cm}^3$.

It is described that in a flat-type MOS transistor, a sidewall of a LDD region is composed of polycrystal silicon having the same conductivity type as a low-concentration layer, and surface carriers of the LDD region are induced by a difference in work function, thereby decreasing the impedance of the LDD region as compared an oxide film sidewall LDD-type MOS transistor (refer to, for example, Japanese Unexamined Patent Application Publication No. 11-297984). It is also described that the polycrystal silicon sidewall is electrically insulated from the gate electrode. Also, drawings show that the polycrystal silicon sidewall is insulated from source/drain through an interlayer insulating film.

SUMMARY OF THE INVENTION

Accordingly, an object of the present invention is to provide a SGT structure having a structure for decreasing the resistance of an upper portion of a silicon pillar and a method for manufacturing the SGT.

A semiconductor device according to a first embodiment of the present invention includes:

a planar semiconductor layer formed on a semiconductor substrate;

a first pillar-shaped semiconductor layer formed on the planar semiconductor layer;

a gate insulating film formed around the first pillar-shaped semiconductor layer;

a first gate electrode formed around the gate insulating film;

a gate line connected to the first gate electrode;

a first first-conductivity-type diffusion layer formed in an upper portion of the first pillar-shaped semiconductor layer;

a second first-conductivity-type diffusion layer formed in a lower portion of the first pillar-shaped semiconductor layer and in an upper portion of the planar semiconductor layer;

a first sidewall having a laminated structure of an insulating film and polysilicon and being formed on an upper sidewall of the first pillar-shaped semiconductor layer and on an upper portion of the first gate electrode; and a first contact formed on the first first-conductivity-type diffusion layer and the first sidewall, wherein the first contact is connected to the polysilicon of the first sidewall; and the conductivity type of the polysilicon of the first sidewall is the first conductivity type.

The semiconductor device preferably includes a first silicide formed on the first first-conductivity-type diffusion layer and on the first sidewall.

The lower surface of the first first-conductivity-type diffusion layer is preferably higher than the upper surface of the first gate electrode.

The first gate electrode preferably has a laminated structure of a metal and polysilicon.

A semiconductor device according to a second embodiment of the present invention further includes, in the semiconductor device according to the first embodiment:

the planar semiconductor layer formed on the semiconductor substrate;

a second pillar-shaped semiconductor layer formed on the planar semiconductor layer;

the gate insulating film formed around the second pillar-shaped semiconductor layer;

a second gate electrode formed around the gate insulating film;

the gate line connected to the second gate electrode;

a first second-conductivity-type diffusion layer formed in an upper portion of the second pillar-shaped semiconductor layer;

a second second-conductivity-type diffusion layer formed in a lower portion of the second pillar-shaped semiconductor layer and in an upper portion of the planar semiconductor layer;

a second sidewall having a laminated structure of an insulating film and polysilicon and being formed on an upper sidewall of the second pillar-shaped semiconductor layer and on an upper portion of the second gate electrode; and a second contact formed on the first second-conductivity-type diffusion layer and on the second sidewall, wherein the second contact is connected to the polysilicon of the second sidewall; and the conductivity type of the polysilicon of the second sidewall is the second conductivity type.

The semiconductor device preferably includes a first silicide formed on the first first-conductivity-type diffusion layer and on the first sidewall, and a second silicide formed on the first second-conductivity-type diffusion layer and on the second sidewall.

The lower surface of the first first-conductivity-type diffusion layer is preferably higher than the upper surface of the first gate electrode, and the lower surface of the first second-conductivity-type diffusion layer is preferably higher than the upper surface of the second gate electrode.

The first gate electrode preferably has a laminated structure of a metal and polysilicon, and the second gate electrode preferably has a laminated structure of a metal and polysilicon.

The first sidewall can be formed by depositing the insulating film and the polysilicon on the first pillar-shaped semiconductor layer and etching the polysilicon to leave it as a sidewall.

According to the present invention, contact etching is stopped by the polysilicon of the first sidewall having a laminated structure including the insulating film and the polysilicon and formed on an upper sidewall of the first pillar-shaped silicon layer and an upper portion of the first gate electrode. Since the insulating film of the first sidewall is thin and held in the polysilicon, the etching rate is decreased to stop contact etching by the first sidewall. Therefore, the height from the upper surface of the first first-conductivity-type diffusion layer to the upper surface of the first gate electrode can be decreased.

Also since the conductivity type of the polysilicon of the first sidewall is the first conductivity type, surface carriers are induced by a difference in work function, and thus the resistance in an upper portion of a pillar-shaped silicon layer can be decreased. For example, when the first sidewall is n+ type, and the pillar-shaped silicon layer has a low impurity concentration, a transistor composed of the first sidewall and the pillar-shaped silicon layer is turned on when a voltage applied to the first sidewall through the contact is 0 V.

As described above, when the lower surface of the first first-conductivity-type diffusion layer is higher than the upper surface of the first gate electrode, a channel of the transistor can be electrically connected to the first first-conductivity-type diffusion layer.

When an impurity is introduced so that the lower surface of the first first-conductivity-type diffusion layer is higher than the upper surface of the first gate electrode, a shallow junction is formed, thereby reducing the widening of the diffusion layer in the lateral direction. That is, higher integration can be realized.

The polysilicon of the first sidewall is formed on an upper sidewall of the pillar-shaped silicon layer, and thus the first sidewall has a larger diameter than that of the pillar-shaped silicon layer. Although the pillar-shaped silicon layer becomes thin and thus has difficulty in implanting impurities in the pillar-shaped silicon layer, impurities can be implanted into the polysilicon of the first sidewall. Therefore, a channel of the transistor can be electrically connected to the first first-conductivity-type diffusion layer.

BRIEF DESCRIPTION OF THE DRAWINGS

FIG. 3(a) is a plan view of a method for manufacturing a semiconductor device according to an embodiment of the present invention. FIG. 3(b) is a cross-sectional view taken along line X-X' in FIG. 3(a). FIG. 3(c) is a cross-sectional view taken along line Y-Y' in FIG. 3(a).

FIG. 6(a) is a plan view of a method for manufacturing a semiconductor device according to an embodiment of the present invention. FIG. 6(b) is a cross-sectional view taken along line X-X' in FIG. 6(a). FIG. 6(c) is a cross-sectional view taken along line Y-Y' in FIG. 6(a).

FIG. 8(a) is a plan view of a method for manufacturing a semiconductor device according to an embodiment of the present invention. FIG. 8(b) is a cross-sectional view taken along line X-X' in FIG. 8(a). FIG. 8(c) is a cross-sectional view taken along line Y-Y' in FIG. 8(a).

FIG. 12(a) is a plan view of a method for manufacturing a semiconductor device according to an embodiment of the present invention. FIG. 12(b) is a cross-sectional view taken along line X-X' in FIG. 12(a). FIG. 12(c) is a cross-sectional view taken along line Y-Y' in FIG. 12(a).

FIG. 13(a) is a plan view of a method for manufacturing a semiconductor device according to an embodiment of the present invention. FIG. 13(b) is a cross-sectional view taken along line X-X' in FIG. 13(a). FIG. 13(c) is a cross-sectional view taken along line Y-Y' in FIG. 13(a).

FIG. 14(a) is a plan view of a method for manufacturing a semiconductor device according to an embodiment of the present invention. FIG. 14(b) is a cross-sectional view taken along line X-X' in FIG. 14(a). FIG. 14(c) is a cross-sectional view taken along line Y-Y' in FIG. 14(a).

FIG. 15(a) is a plan view of a method for manufacturing a semiconductor device according to an embodiment of the present invention. FIG. 15(b) is a cross-sectional view taken along line X-X' in FIG. 15(a). FIG. 15(c) is a cross-sectional view taken along line Y-Y' in FIG. 15(a).

FIG. 16(a) is a plan view of a method for manufacturing a semiconductor device according to an embodiment of the present invention. FIG. 16(b) is a cross-sectional view taken along line X-X' in FIG. 16(a). FIG. 16(c) is a cross-sectional view taken along line Y-Y' in FIG. 16(a).

FIG. 17(a) is a plan view of a method for manufacturing a semiconductor device according to an embodiment of the present invention. FIG. 17(b) is a cross-sectional view taken along line X-X' in FIG. 17(a). FIG. 17(c) is a cross-sectional view taken along line Y-Y' in FIG. 17(a).

FIG. 18(a) is a plan view of a method for manufacturing a semiconductor device according to an embodiment of the present invention. FIG. 18(b) is a cross-sectional view taken along line X-X' in FIG. 18(a). FIG. 18(c) is a cross-sectional view taken along line Y-Y' in FIG. 18(a).

FIG. 19(a) is a plan view of a method for manufacturing a semiconductor device according to an embodiment of the present invention. FIG. 19(b) is a cross-sectional view taken along line X-X' in FIG. 19(a). FIG. 19(c) is a cross-sectional view taken along line Y-Y' in FIG. 19(a).

FIG. 20(a) is a plan view of a method for manufacturing a semiconductor device according to an embodiment of the present invention. FIG. 20(b) is a cross-sectional view taken along line X-X' in FIG. 20(a). FIG. 20(c) is a cross-sectional view taken along line Y-Y' in FIG. 20(a).

FIG. 21(a) is a plan view of a method for manufacturing a semiconductor device according to an embodiment of the present invention. FIG. 21(b) is a cross-sectional view taken along line X-X' in FIG. 21(a). FIG. 21(c) is a cross-sectional view taken along line Y-Y' in FIG. 21(a).

FIG. 22(a) is a plan view of a method for manufacturing a semiconductor device according to an embodiment of the present invention. FIG. 22(b) is a cross-sectional view taken along line X-X' in FIG. 22(a). FIG. 22(c) is a cross-sectional view taken along line Y-Y' in FIG. 22(a).

FIG. 23(a) is a plan view of a method for manufacturing a semiconductor device according to an embodiment of the present invention. FIG. 23(b) is a cross-sectional view taken along line X-X' in FIG. 23(a). FIG. 23(c) is a cross-sectional view taken along line Y-Y' in FIG. 23(a).

FIG. 24(a) is a plan view of a method for manufacturing a semiconductor device according to an embodiment of the present invention. FIG. 24(b) is a cross-sectional view taken along line X-X' in FIG. 24(a). FIG. 24(c) is a cross-sectional view taken along line Y-Y' in FIG. 24(a).

FIG. 25(a) is a plan view of a method for manufacturing a semiconductor device according to an embodiment of the present invention. FIG. 25(b) is a cross-sectional view taken along line X-X' in FIG. 25(a). FIG. 25(c) is a cross-sectional view taken along line Y-Y' in FIG. 25(a).

FIG. 26(a) is a plan view of a method for manufacturing a semiconductor device according to an embodiment of the present invention. FIG. 26(b) is a cross-sectional view taken along line X-X' in FIG. 26(a). FIG. 26(c) is a cross-sectional view taken along line Y-Y' in FIG. 26(a).

FIG. 27(a) is a plan view of a method for manufacturing a semiconductor device according to an embodiment of the present invention. FIG. 27(b) is a cross-sectional view taken along line X-X' in FIG. 27(a). FIG. 27(c) is a cross-sectional view taken along line Y-Y' in FIG. 27(a).

FIG. 28(a) is a plan view of a method for manufacturing a semiconductor device according to an embodiment of the present invention. FIG. 28(b) is a cross-sectional view taken along line X-X' in FIG. 28(a). FIG. 28(c) is a cross-sectional view taken along line Y-Y' in FIG. 28(a).

FIG. 29(a) is a plan view of a method for manufacturing a semiconductor device according to an embodiment of the present invention. FIG. 29(b) is a cross-sectional view taken along line X-X' in FIG. 29(a). FIG. 29(c) is a cross-sectional view taken along line Y-Y' in FIG. 29(a).

FIG. 30(a) is a plan view of a method for manufacturing a semiconductor device according to an embodiment of the present invention. FIG. 30(b) is a cross-sectional view taken along line X-X' in FIG. 30(a). FIG. 30(c) is a cross-sectional view taken along line Y-Y' in FIG. 30(a).

FIG. 31(a) is a plan view of a method for manufacturing a semiconductor device according to an embodiment of the present invention. FIG. 31(b) is a cross-sectional view taken along line X-X' in FIG. 31(a). FIG. 31(c) is a cross-sectional view taken along line Y-Y' in FIG. 31(a).

FIG. 32(a) is a plan view of a method for manufacturing a semiconductor device according to an embodiment of the present invention. FIG. 32(b) is a cross-sectional view taken along line X-X' in FIG. 32(a). FIG. 32(c) is a cross-sectional view taken along line Y-Y' in FIG. 32(a).

FIG. 34(a) is a plan view of a method for manufacturing a semiconductor device according to an embodiment of the present invention. FIG. 34(b) is a cross-sectional view taken along line X-X' in FIG. 34(a). FIG. 34(c) is a cross-sectional view taken along line Y-Y' in FIG. 34(a).

FIG. 36(a) is a plan view of a method for manufacturing a semiconductor device according to an embodiment of the present invention. FIG. 36(b) is a cross-sectional view taken along line X-X' in FIG. 36(a). FIG. 36(c) is a cross-sectional view taken along line Y-Y' in FIG. 36(a).

FIG. 37(a) is a plan view of a method for manufacturing a semiconductor device according to an embodiment of the present invention. FIG. 37(b) is a cross-sectional view taken along line X-X' in FIG. 37(a). FIG. 37(c) is a cross-sectional view taken along line Y-Y' in FIG. 37(a).

DETAILED DESCRIPTION OF THE PREFERRED EMBODIMENTS

Figure 1:
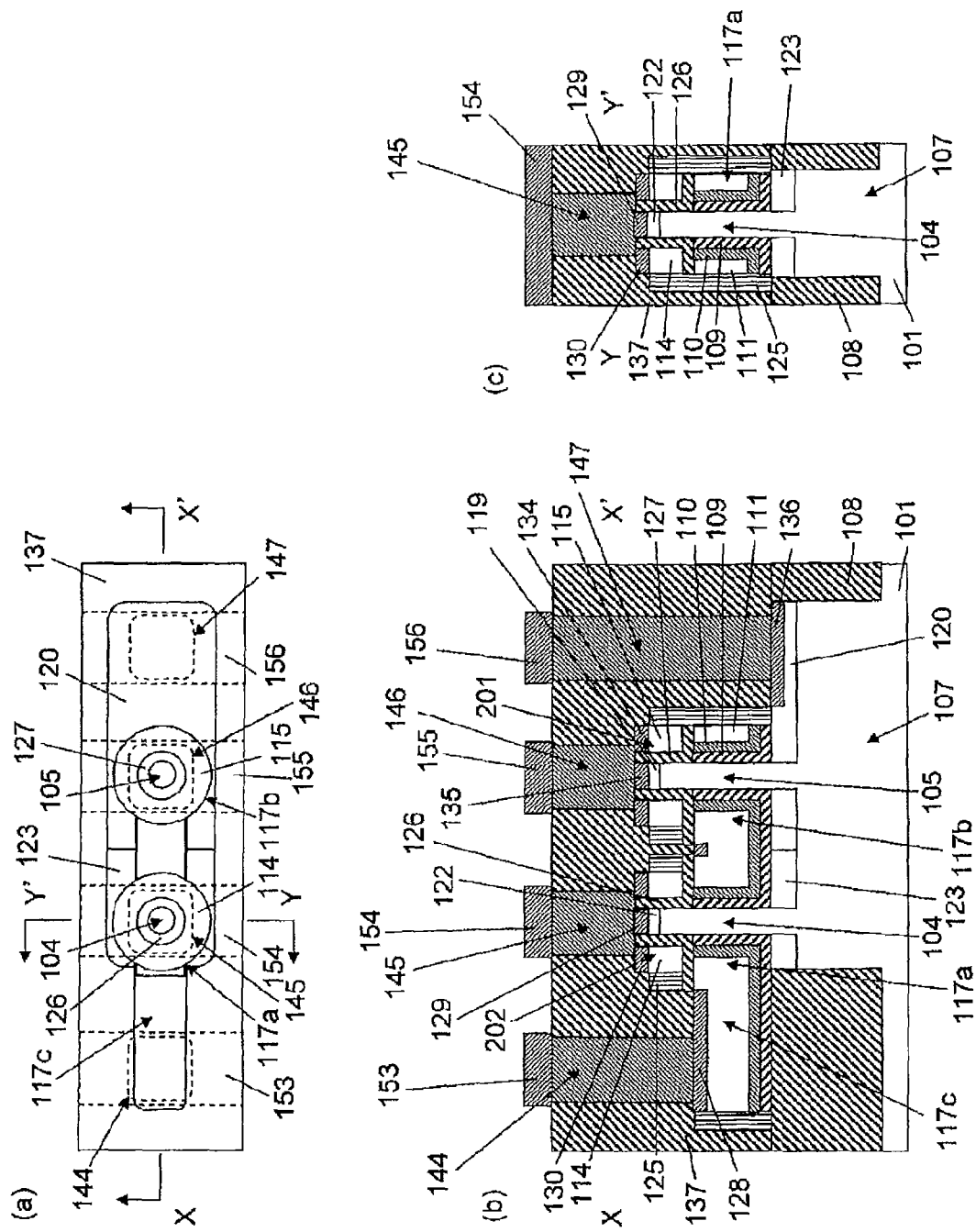
FIG. 1(a) is a plan view of a semiconductor device according to an embodiment of the present invention.
FIG. 1(b) is a cross-sectional view taken along line X-X' in FIG. 1(a).
FIG. 1(c) is a cross-sectional view taken along line Y-Y' in FIG. 1(a).

A semiconductor device having a SGT structure according to an embodiment of the present invention is described below with reference to FIG. 1.

A semiconductor device having a SGT structure according to an embodiment of the present invention includes:

a planar silicon layer 107 formed on a silicon substrate 101;

a first pillar-shaped silicon layer 105 formed on the planar silicon layer 107;

a gate insulating film 109 formed around the first pillar-shaped silicon layer 105;

a first gate electrode 117b formed around the gate insulating film 109;

a gate line 117c connected to the first gate electrode 117b;

a first n-type diffusion layer 119 formed in an upper portion of the first pillar-shaped silicon layer 105;

a second n-type diffusion layer 120 formed in a lower portion of the first pillar-shaped silicon layer 105 and in an upper portion of the planar silicon layer 107;

a first sidewall 201 having a laminated structure of an insulating film 127 and polysilicon 115 and being formed on an upper sidewall of the first pillar-shaped silicon layer 105 and an upper portion of the first gate electrode 117b; and a first contact 146 formed on the first n-type diffusion layer 119 and the first sidewall 201, wherein the first contact 146 is connected to the polysilicon 115 of the first sidewall 201; and the conductivity type of the polysilicon 115 of the first sidewall 201 is n-type.

The semiconductor device further includes first silicides 135 and 134 formed on the first n-type diffusion layer 119 and the first sidewall 201. A silicide satisfactorily stops contact etching because of a high selection ratio for etching an oxide film.

Contact etching is stopped by the polysilicon 115 of the first sidewall 201 which has a laminated structure including the insulating film 127 and the polysilicon 115 and which is formed on an upper sidewall of the first pillar-shaped silicon layer 105 and an upper portion of the first gate electrode 117b. Since the insulating film 127 of the first sidewall 201 is thin and held in the polysilicon 115, the etching rate is decreased to stop contact etching by the first sidewall 201. Therefore, the height from the upper surface of the first n-type diffusion layer to the upper surface of the first gate electrode 117b can be reduced.

Also since the conductivity type of the polysilicon of the first sidewall 201 is n-type, surface carriers are induced by a difference in work function, and thus the resistance in an upper portion of a pillar-shaped silicon layer 105 can be decreased. For example, when the first sidewall 201 is n+-type, and the pillar-shaped silicon layer 105 has a low impurity concentration, a transistor composed of the first sidewall 201 and the pillar-shaped silicon layer 105 is turned on when a voltage applied to the first sidewall 201 through the contact 146 is 0 V.

As described above, when the lower surface of the first n-type diffusion layer 119 is higher than the upper surface of the first gate electrode 117b, a channel of the transistor can be electrically connected to the first n-type diffusion layer 119.

When impurities are introduced so that the lower surface of the first n-type diffusion layer 119 is higher than the upper surface of the first gate electrode 117b, a shallow junction is formed, thereby reducing the widening of the diffusion layer in the lateral direction. That is, higher integration can be realized.

The polysilicon of the first sidewall 201 is formed on an upper sidewall of the pillar-shaped silicon layer 105, and thus the first sidewall 201 has a larger diameter than that of the pillar-shaped silicon layer 105. Although the pillar-shaped silicon layer 105 becomes thin and thus has difficulty in implanting an impurity in the pillar-shaped silicon layer 105, an impurity can be implanted into the polysilicon 115 of the first sidewall 201. Therefore, a channel of the transistor can be electrically connected to the first n-type diffusion layer.

The first gate electrode 117b has a laminated structure of a metal 110 and polysilicon 111.

Consequently, SGT has the first sidewall 201 having a laminated structure of the insulating film 127 and the polysilicon 115 and formed on an upper sidewall of the first pillar-shaped silicon layer 105 and an upper portion of the first gate electrode 117b.

CMOS SGT using the SGT according to the embodiment of the present invention is described below. The CMOS SGT includes:

a second pillar-shaped silicon layer 104 formed on the planar silicon layer 107;

the gate insulating film 109 formed around the second pillar-shaped silicon layer 104;

a second gate electrode 117a formed around the gate insulating film 109;

the gate line 117c connected to the second gate electrode 117a;

a first p-type diffusion layer 122 formed in an upper portion of the second pillar-shaped silicon layer 104;

a second p-type diffusion layer 123 formed in a lower portion of the second pillar-shaped silicon layer 104 and an upper portion of the planar silicon layer 107;

a second sidewall 202 having a laminated structure of an insulating film 126 and polysilicon 114 and being formed on an upper sidewall of the second pillar-shaped silicon layer 104 and on an upper portion of the second gate electrode 117a; and a second contact 145 formed on the first p-type diffusion layer 122 and on the second sidewall 202, wherein the second contact 145 is connected to the polysilicon 114 of the second sidewall 202; and the conductivity type of the polysilicon 114 of the second sidewall 202 is p-type.

The CMOS SGT further includes second silicides 129 and 130 formed on the first p-type diffusion layer 122 and the first sidewall 202.

The lower surface of the first p-type diffusion layer 122 is higher than the upper surface of the second gate electrode 117a.

The second gate electrode 117a has a laminated structure of a metal 110 and polysilicon 111.

The second n-type diffusion layer 120 and the second p-type diffusion layer 123 are connected to each other through a silicide.

The CMOS SGT using the SGT according to the present invention is described above.

A process for manufacturing a semiconductor device having a SGT structure according to an embodiment of the present invention is described below with reference to FIGS. 2 to 43.

Figure 2:
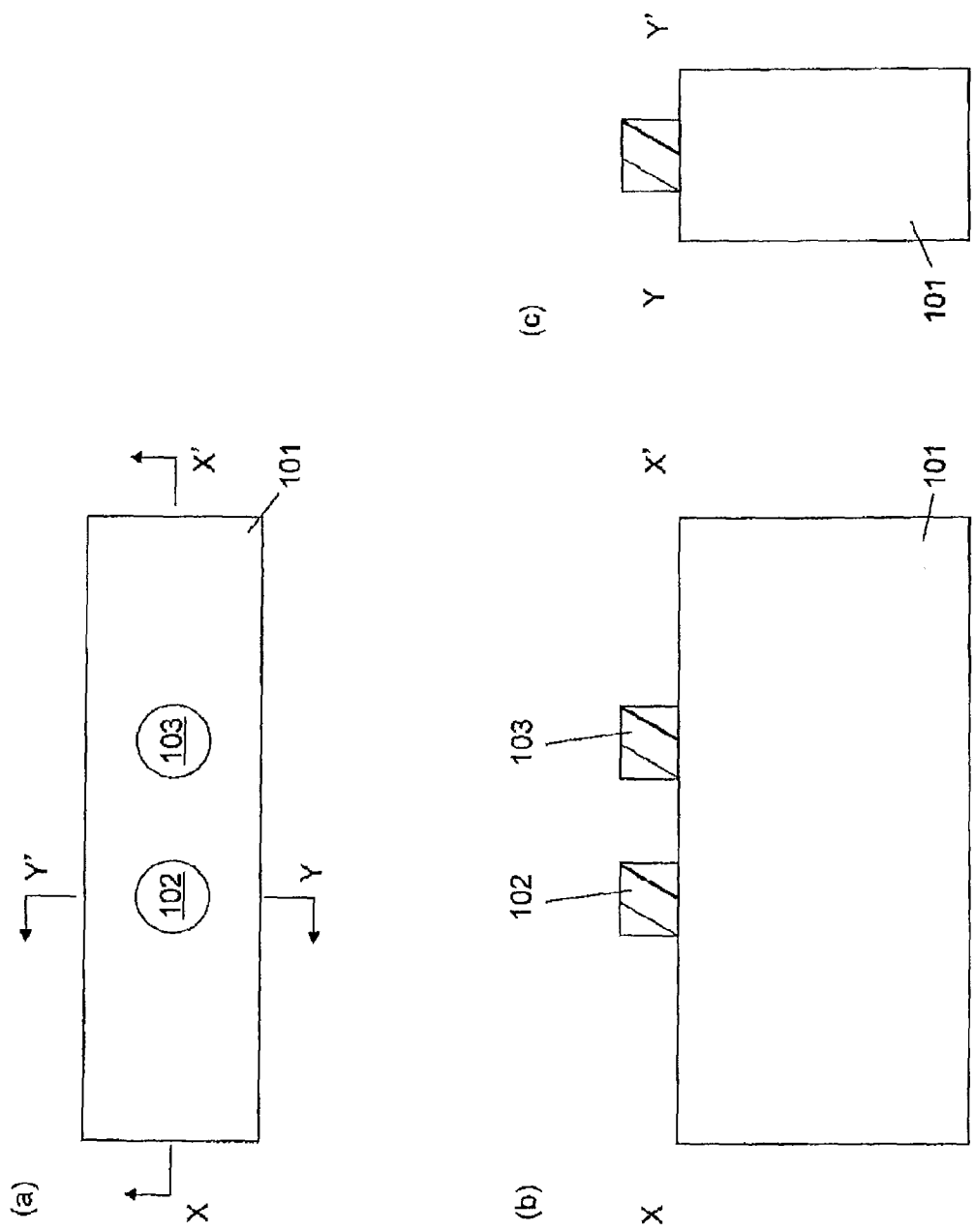
FIG. 2(a) is a plan view of a method for manufacturing a semiconductor device according to an embodiment of the present invention.
FIG. 2(b) is a cross-sectional view taken along line X-X' in FIG. 2(a).
FIG. 2(c) is a cross-sectional view taken along line Y-Y' in FIG. 2(a).

First, as shown in FIG. 2, first resists 102 and 103 are formed for forming the first pillar-shaped silicon layer 105 and the second pillar-shaped silicon layer 104 on the silicon substrate 101.

Next, as shown in FIG. 3, the silicon substrate 101 is etched to form the first pillar-shaped silicon layer 105 and the second pillar-shaped silicon layer 104.

Figure 4:
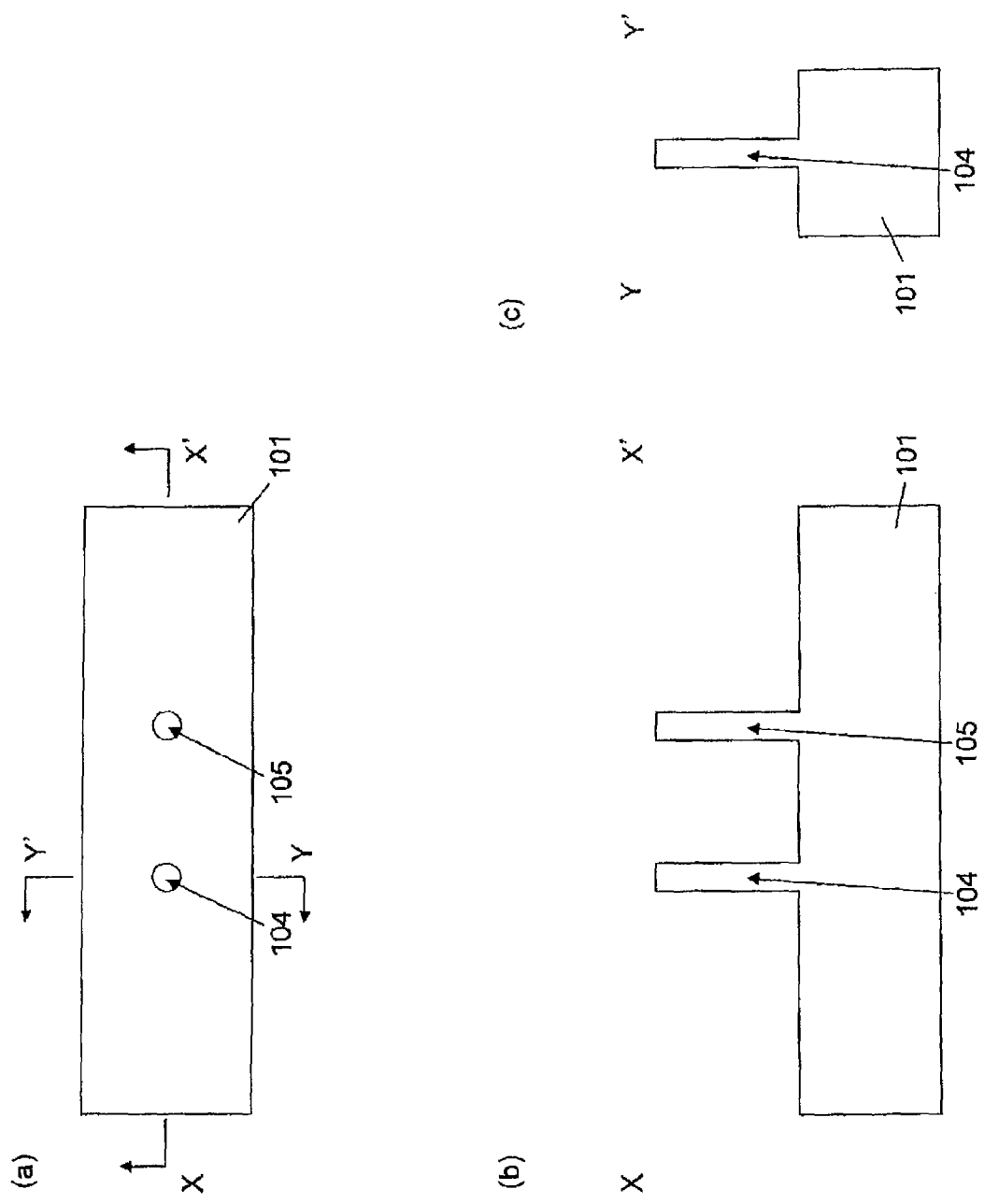
FIG. 4(a) is a plan view of a method for manufacturing a semiconductor device according to an embodiment of the present invention.
FIG. 4(b) is a cross-sectional view taken along line X-X' in FIG. 4(a).
FIG. 4(c) is a cross-sectional view taken along line Y-Y' in FIG. 4(a).

Then, as shown in FIG. 4, the first resists 102 and 103 are removed.

Figure 5:
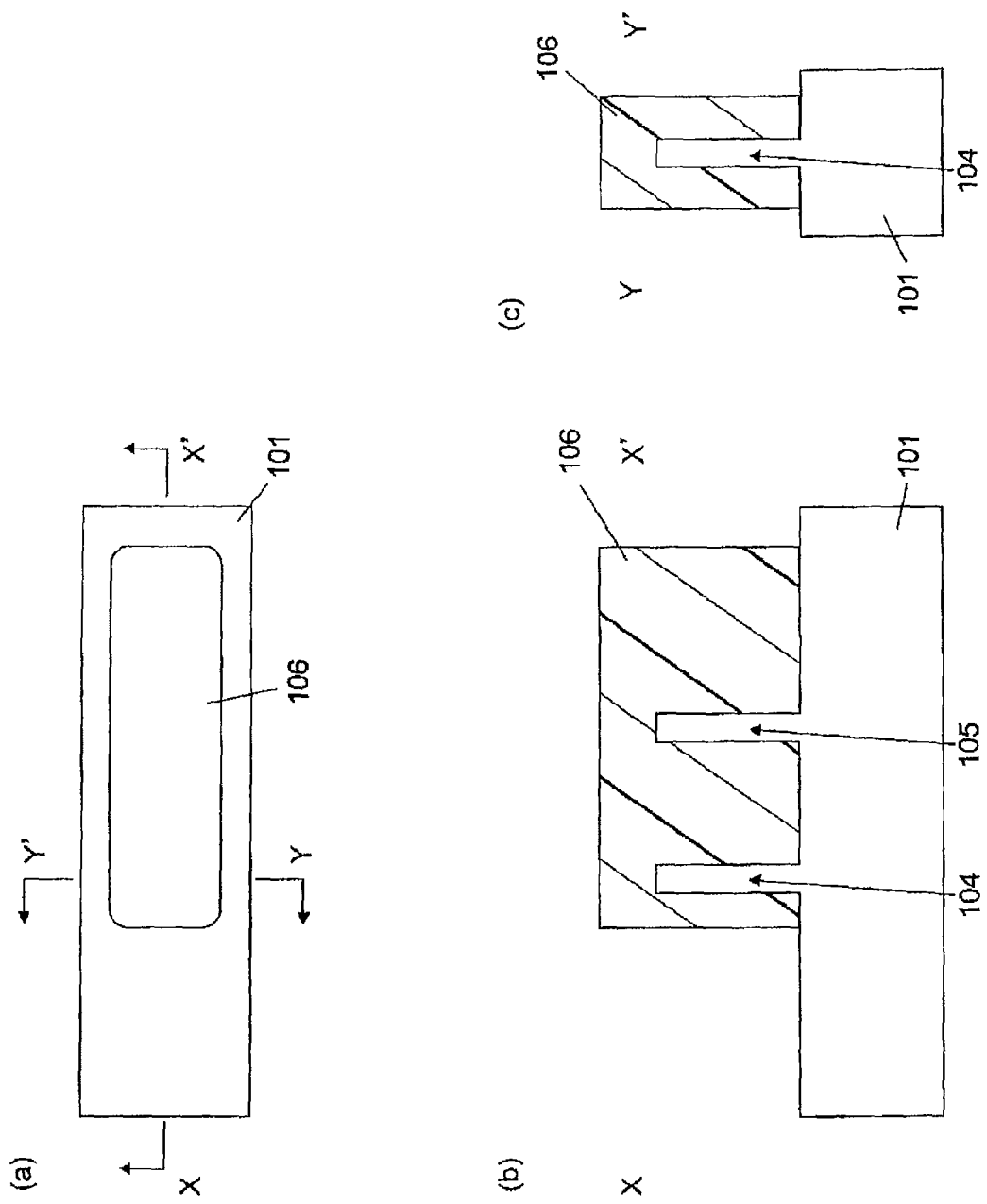
FIG. 5(a) is a plan view of a method for manufacturing a semiconductor device according to an embodiment of the present invention.
FIG. 5(b) is a cross-sectional view taken along line X-X' in FIG. 5(a).
FIG. 5(c) is a cross-sectional view taken along line Y-Y' in FIG. 5(a).

Then, as shown in FIG. 5, a second resist 106 is formed for forming the planar silicon layer 107.

Then, as shown in FIG. 6, the silicon substrate 101 is etched to form the planar silicon layer 107.

Figure 7:
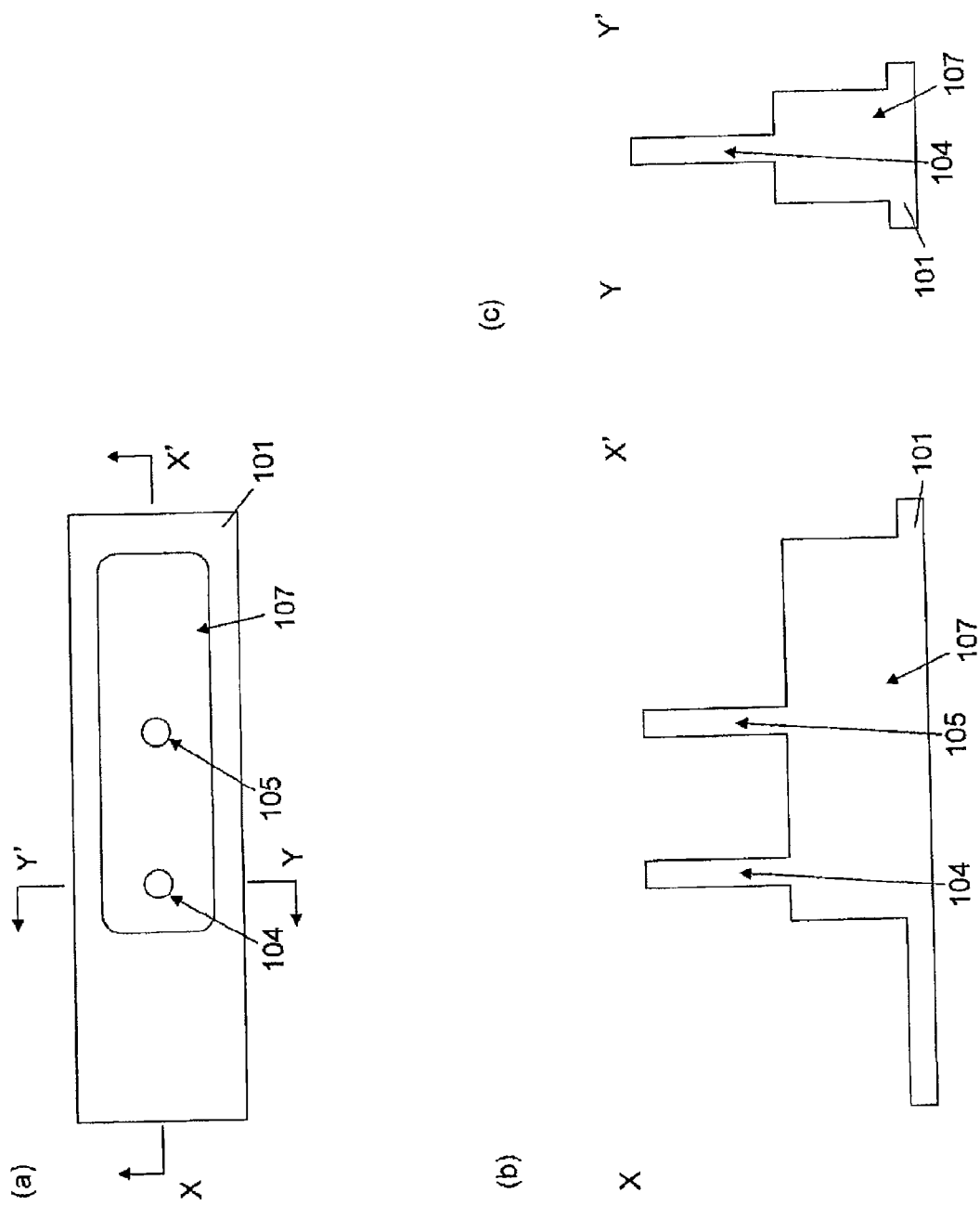
FIG. 7(a) is a plan view of a method for manufacturing a semiconductor device according to an embodiment of the present invention.
FIG. 7(b) is a cross-sectional view taken along line X-X' in FIG. 7(a).
FIG. 7(c) is a cross-sectional view taken along line Y-Y' in FIG. 7(a).

Then, as shown in FIG. 7, the second resist 106 is removed.

Next, as shown in FIG. 8, an oxide film 108 is deposited and the surface thereof is planarized.

Figure 9:
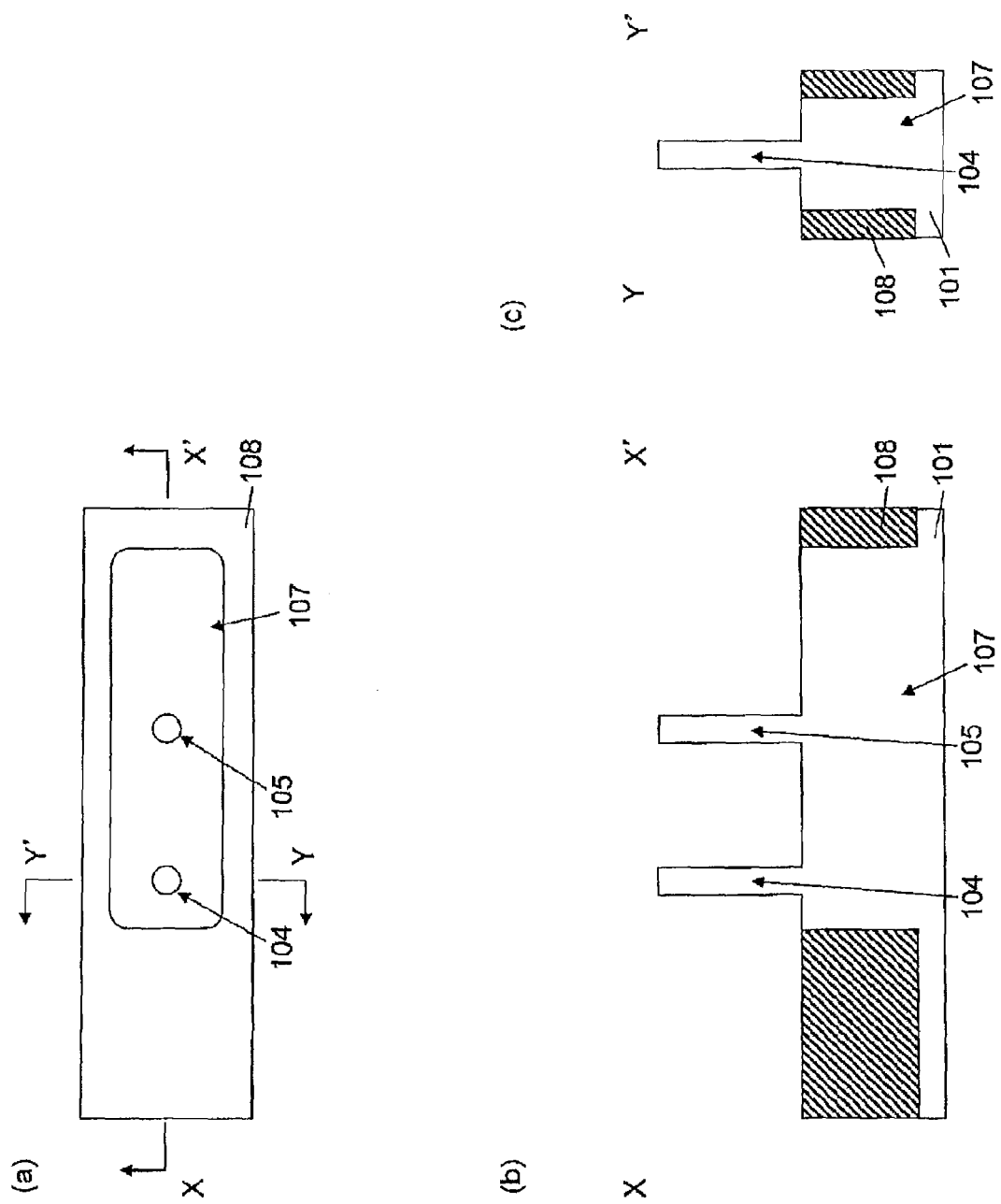
FIG. 9(a) is a plan view of a method for manufacturing a semiconductor device according to an embodiment of the present invention.
FIG. 9(b) is a cross-sectional view taken along line X-X' in FIG. 9(a).
FIG. 9(c) is a cross-sectional view taken along line Y-Y' in FIG. 9(a).

Then, as shown in FIG. 9, the oxide film 108 is etched to be left around the planar silicon layer 107.

Figure 10:
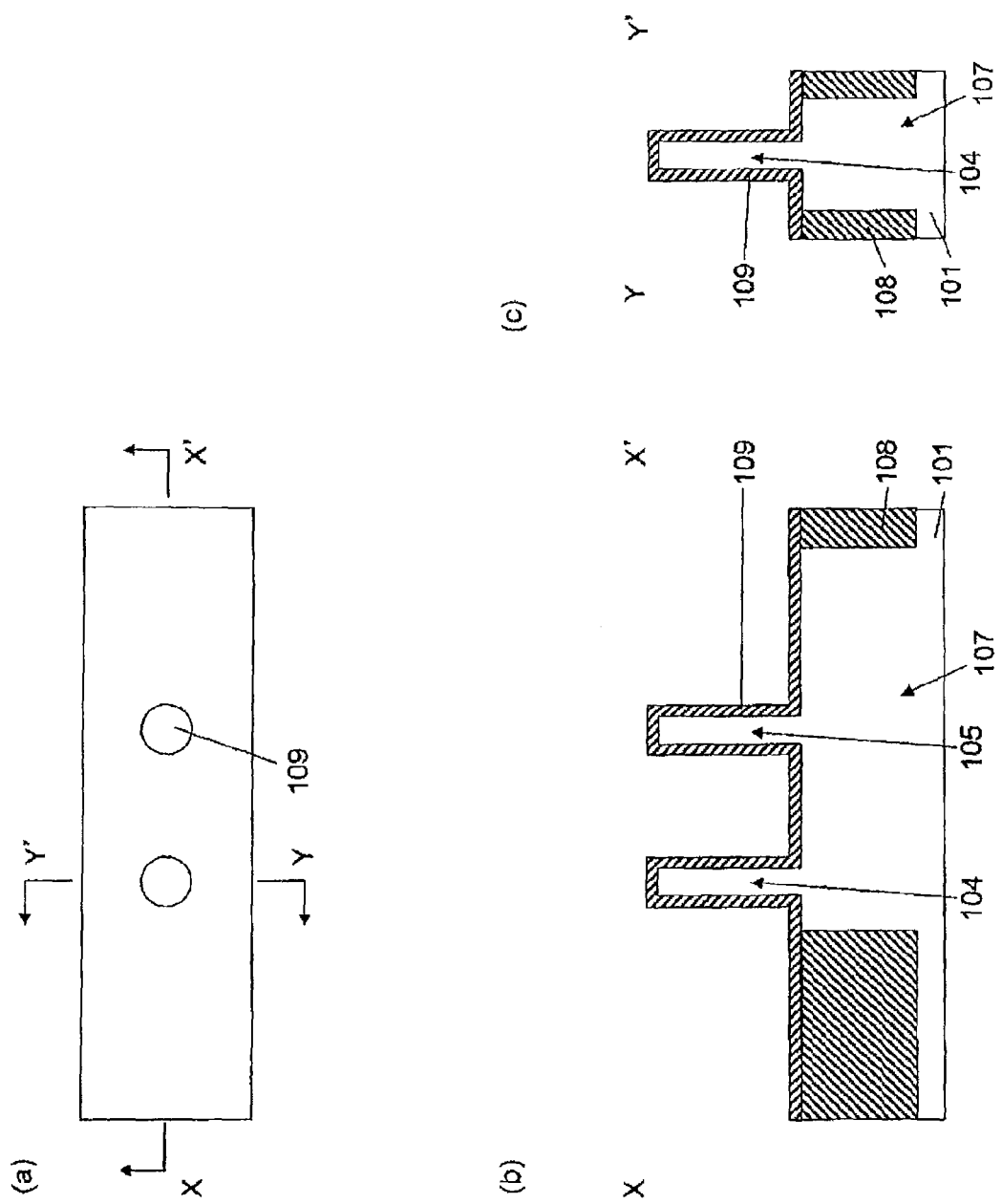
FIG. 10(a) is a plan view of a method for manufacturing a semiconductor device according to an embodiment of the present invention.
FIG. 10(b) is a cross-sectional view taken along line X-X' in FIG. 10(a).
FIG. 10(c) is a cross-sectional view taken along line Y-Y' in FIG. 10(a).

First, as shown in FIG. 10, the gate insulating film 109 is formed around the first pillar-shaped silicon layer 105 and the second pillar-shaped silicon layer 104. In this case, an oxide film, a laminated structure of an oxide film and a nitride film, a nitride film, or a high-dielectric film can be used as a material of the gate insulating film 109.

Figure 11:
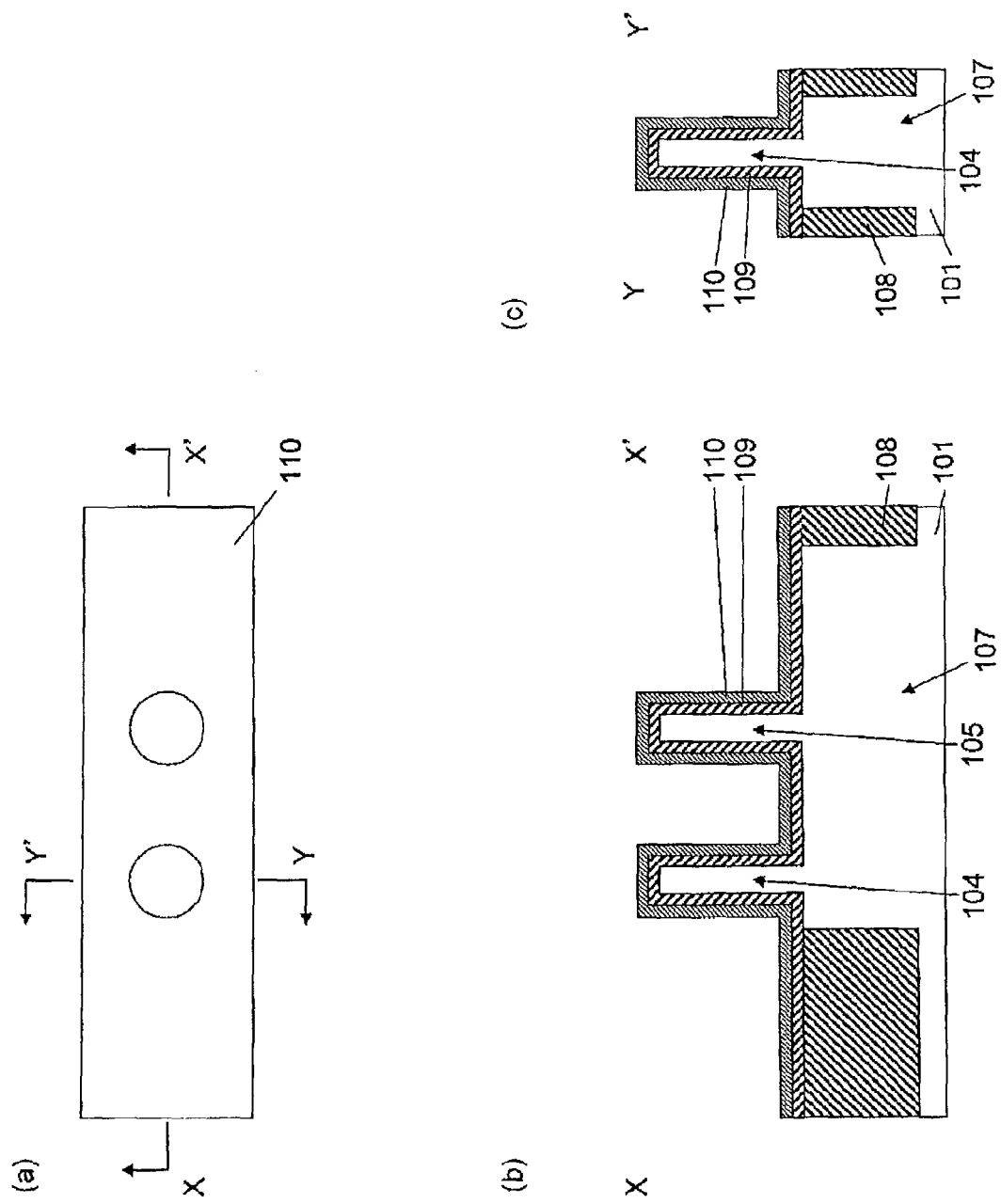
FIG. 11(a) is a plan view of a method for manufacturing a semiconductor device according to an embodiment of the present invention.
FIG. 11(b) is a cross-sectional view taken along line X-X' in FIG. 11(a).
FIG. 11(c) is a cross-sectional view taken along line Y-Y' in FIG. 11(a).

Next, as shown in FIG. 11, the metal film 110 is formed around the gate insulating film 109. A metal material which can be used for a gate electrode, such as titanium, titanium nitride, tantalum, tantalum nitride, or the like, can be used for the metal film 110.

Then, as shown in FIG. 12, polysilicon 111 is deposited and the surface thereof is planarized.

Then, as shown in FIG. 13, the polysilicon 111 is etched.

Then, as shown in FIG. 14, the polysilicon 111 is etched to expose upper portions of the first pillar-shaped silicon layer 105 and the second pillar-shaped silicon layer 104.

Then, as shown in FIG. 15, the metal film 110 is etched. In this case, wet etching is preferably used.

Then, as shown in FIG. 16, a thin insulating film 112 and polysilicon 113 are deposited.

Then, as shown in FIG. 17, the polysilicon 113 is etched to leave the polysilicon 114 and 115 as sidewalls on an upper sidewall of the first pillar-shaped silicon layer 105 and an upper sidewall of the second pillar-shaped silicon layer 104.

Then, as shown in FIG. 18, a third resist 116 is formed for forming the first gate electrode 117b, the second gate electrode 117a, and the gate line 117c.

Then, as shown in FIG. 19, the insulating film 112 is etched.

Then, as shown in FIG. 20, the polysilicon 111, the metal film 110, and the gate insulating film 109 are etched to form the first gate electrode 117b, the second gate electrode 117a, and the gate line 117c.

Then, as shown in FIG. 21, the third resist 116 is removed.

Then, as shown in FIG. 22, a fourth resist 118 is formed for forming the first n-type diffusion layer 119 and the second n-type diffusion layer 120.

Then, as shown in FIG. 23, arsenic is implanted to form the first n-type diffusion layer 119 and the second n-type diffusion layer 120. At this time, arsenic is also implanted into the polysilicon 115 of the sidewall. Also, arsenic is implanted into the polysilicon 115 from the sidewall thereof, thereby easily achieving n-type at a high concentration.

Then, as shown in FIG. 24, the fourth resist 118 is removed.

Then, as shown in FIG. 25, a fifth resist 121 is formed for forming the first p-type diffusion layer 122 and the second p-type diffusion layer 123.

Then, as shown in FIG. 26, boron is implanted to form the first p-type diffusion layer 122 and the second p-type diffusion layer 123. At this time, boron is also implanted into the polysilicon 114 of the sidewall. Also, boron is implanted into the polysilicon 114 from the sidewall thereof, thereby easily achieving p-type at a high-concentration.

Then, as shown in FIG. 27, the fifth resist 121 is removed.

Then, as shown in FIG. 28, the nitride film 124 is deposited.

Then, as shown in FIG. 29, heat treatment is performed. In this treatment, a shallow junction can be formed by decreasing heat treatment. When heat treatment is performed to form a deep junction, the second n-type diffusion layer 120 and the second p-type diffusion layer 123 are widened in the lateral direction, thereby causing difficulty in increasing integration.

Then, as shown in FIG. 30, the nitride film 124 is etched, and the insulating film 112 is etched to form the nitride film sidewall 125. At the same time, the first sidewall 201 including the insulating film 127 and the polysilicon 115 is formed on an upper sidewall of the first pillar-shaped silicon layer 105, and the second sidewall 202 including the insulating film 126 and the polysilicon 114 is formed on an upper sidewall of the second pillar-shaped silicon layer 104.

Then, as shown in FIG. 31, silicide 135, silicide 134, silicide 129, and silicide 130 are formed on the first n-type diffusion layer 119, the polysilicon 115, the first p-type diffusion layer 122, and the polysilicon 114, respectively. In addition, silicides 128, 131, 132, 133, and 136 are formed.

Then, as shown in FIG. 32, an interlayer insulating film 137 is deposited and planarized.

Figure 33:
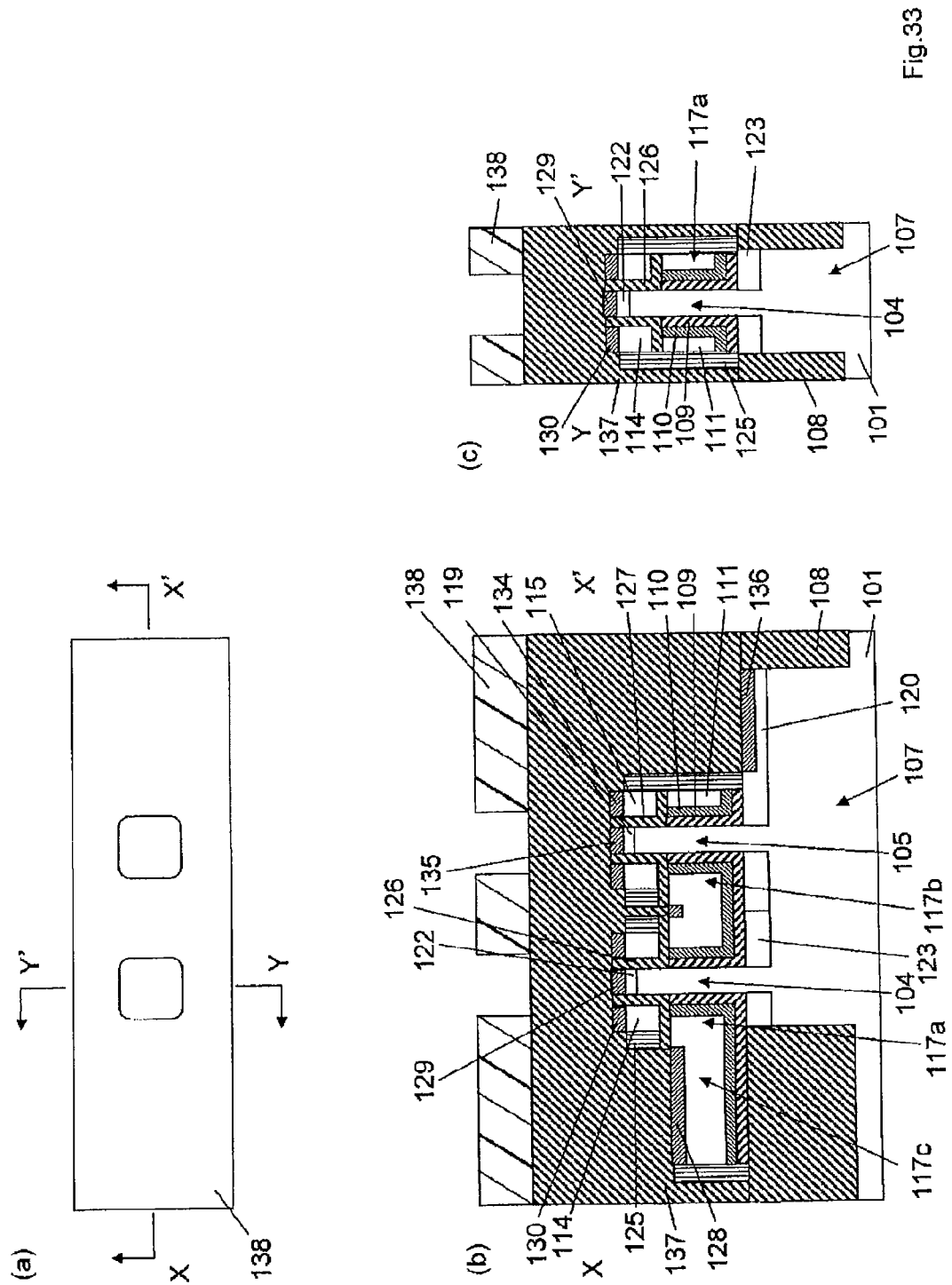
FIG. 33(a) is a plan view of a method for manufacturing a semiconductor device according to an embodiment of the present invention.
FIG. 33(b) is a cross-sectional view taken along line X-X' in FIG. 33(a).
FIG. 33(c) is a cross-sectional view taken along line Y-Y' in FIG. 33(a).

Then, as shown in FIG. 33, a sixth resist 138 is formed for forming the first contact 146 and the second contact 145.

Then, as shown in FIG. 34, the interlayer insulating film 137 is etched to form contact holes 139 and 140. In this case, contact etching is stopped at the polysilicon by the first sidewall having a laminated structure of the insulating film and the polysilicon and being formed on an upper sidewall of the first pillar-shaped silicon layer and an upper portion of the first gate electrode. Since the insulating film of the first sidewall is thin and held in the polysilicon, the etching rate is decreased to stop contact etching by the first sidewall.

Figure 35:
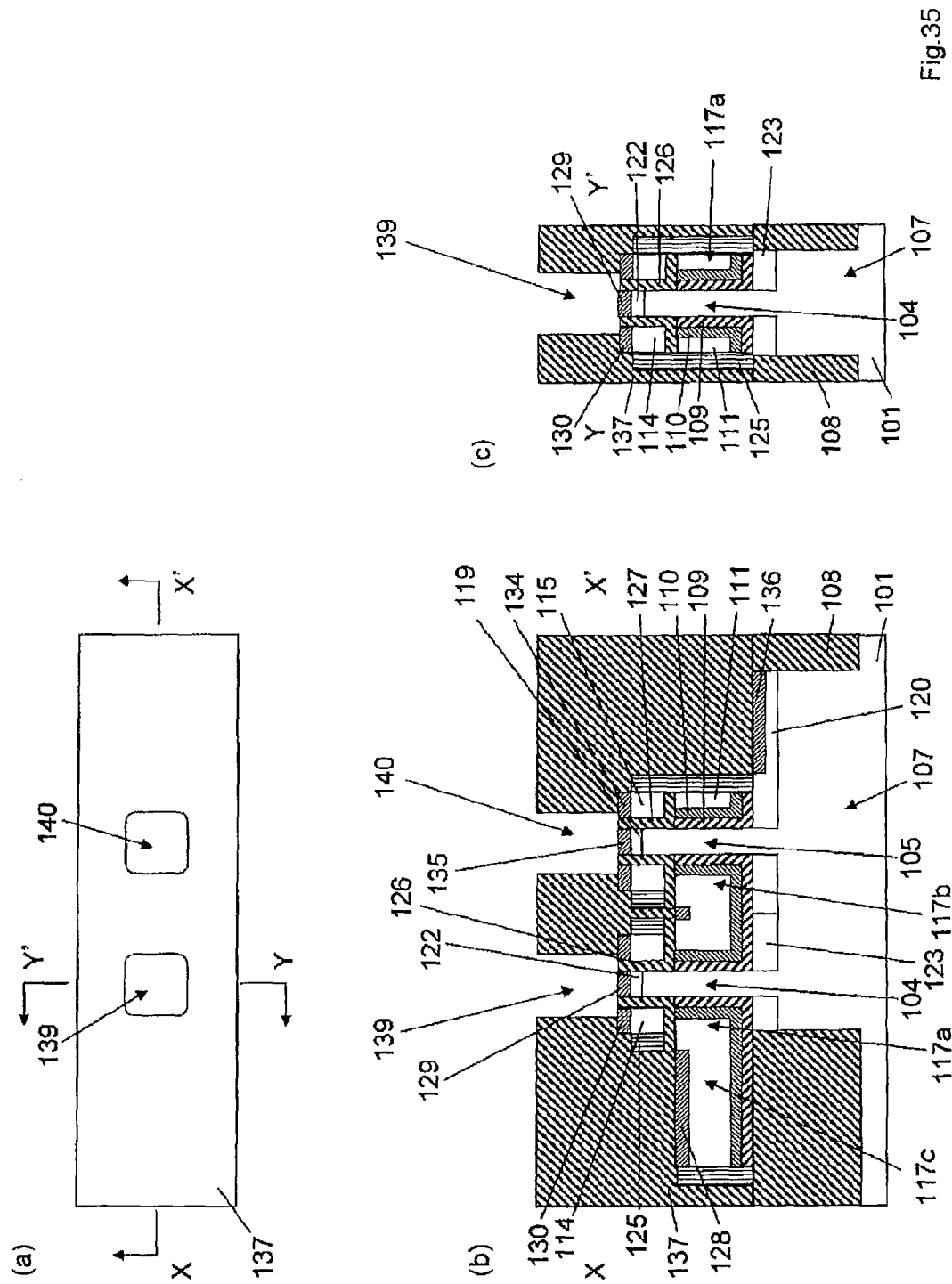
FIG. 35(a) is a plan view of a method for manufacturing a semiconductor device according to an embodiment of the present invention.
FIG. 35(b) is a cross-sectional view taken along line X-X' in FIG. 35(a).
FIG. 35(c) is a cross-sectional view taken along line Y-Y' in FIG. 35(a).

Then, as shown in FIG. 35, the sixth resist 138 is removed.

Then, as shown in FIG. 36, a seventh resist 141 is formed for forming the contacts 144 and 147.

Then, as shown in FIG. 37, the interlayer insulating film 137 is etched to form contact holes 142 and 143.

Figure 38:
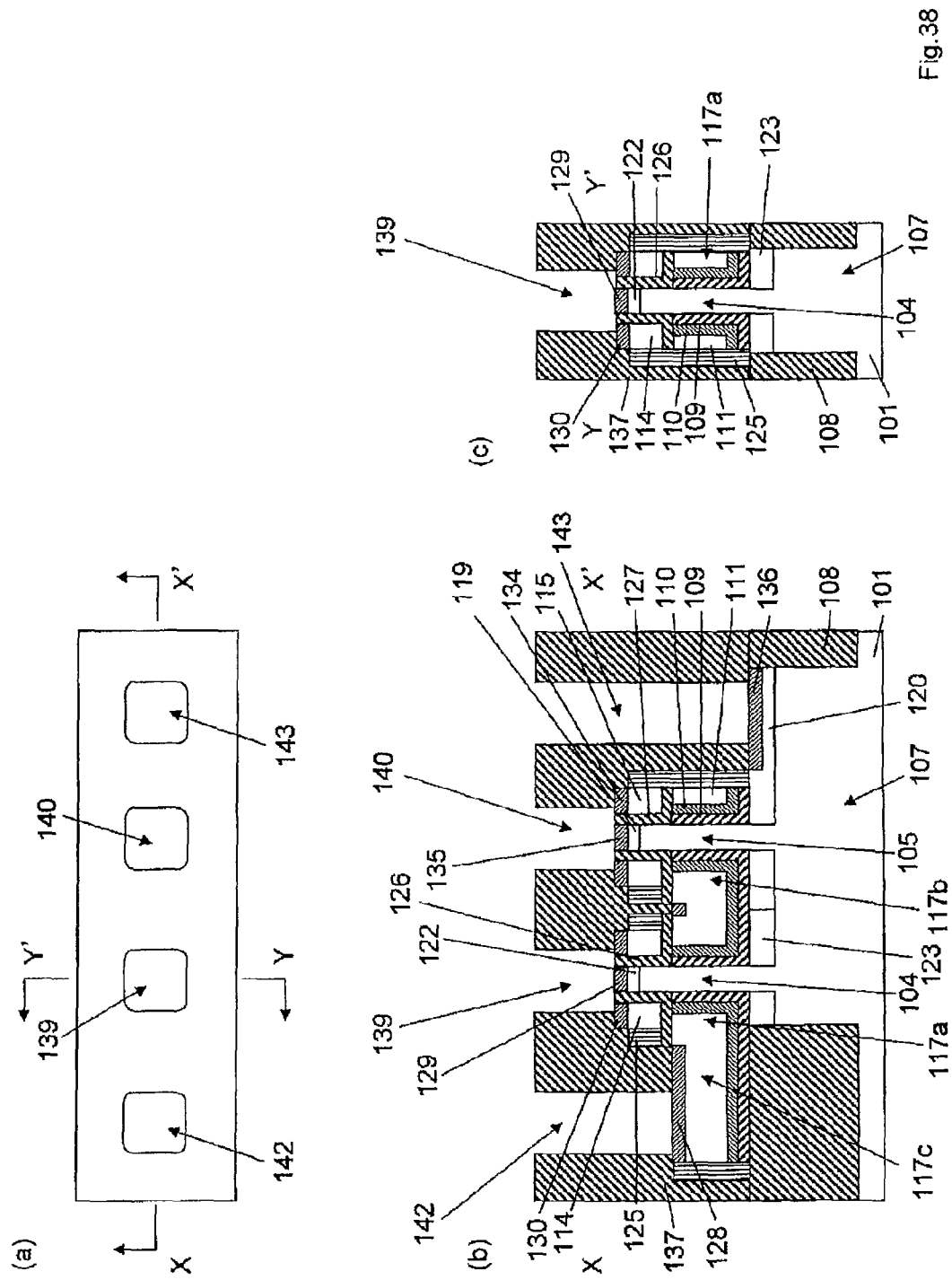
FIG. 38(a) is a plan view of a method for manufacturing a semiconductor device according to an embodiment of the present invention.
FIG. 38(b) is a cross-sectional view taken along line X-X' in FIG. 38(a).
FIG. 38(c) is a cross-sectional view taken along line Y-Y' in FIG. 38(a).

Then, as shown in FIG. 38, the seventh resist 137 is removed.

Figure 39:
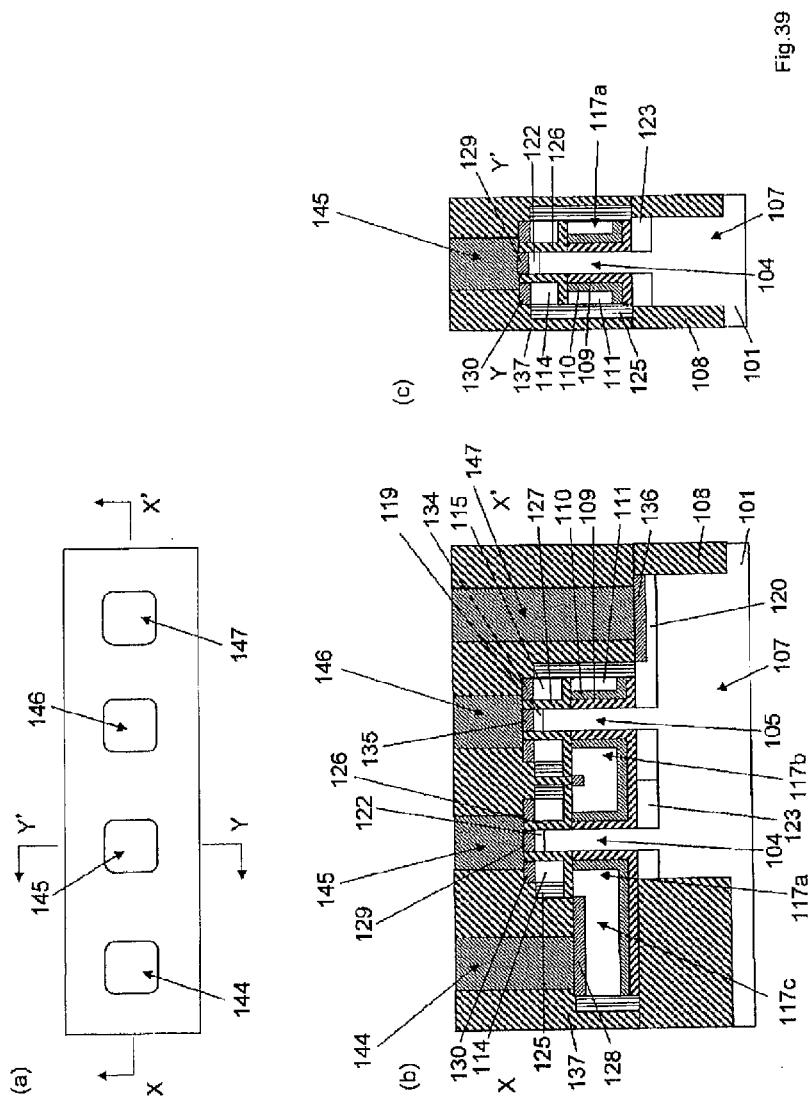
FIG. 39(a) is a plan view of a method for manufacturing a semiconductor device according to an embodiment of the present invention.
FIG. 39(b) is a cross-sectional view taken along line X-X' in FIG. 39(a).
FIG. 39(c) is a cross-sectional view taken along line Y-Y' in FIG. 39(a).

Then, as shown in FIG. 39, a metal is deposited to form the contacts 144 and 147, the first contact 146, and the second contact 145.

Figure 40:
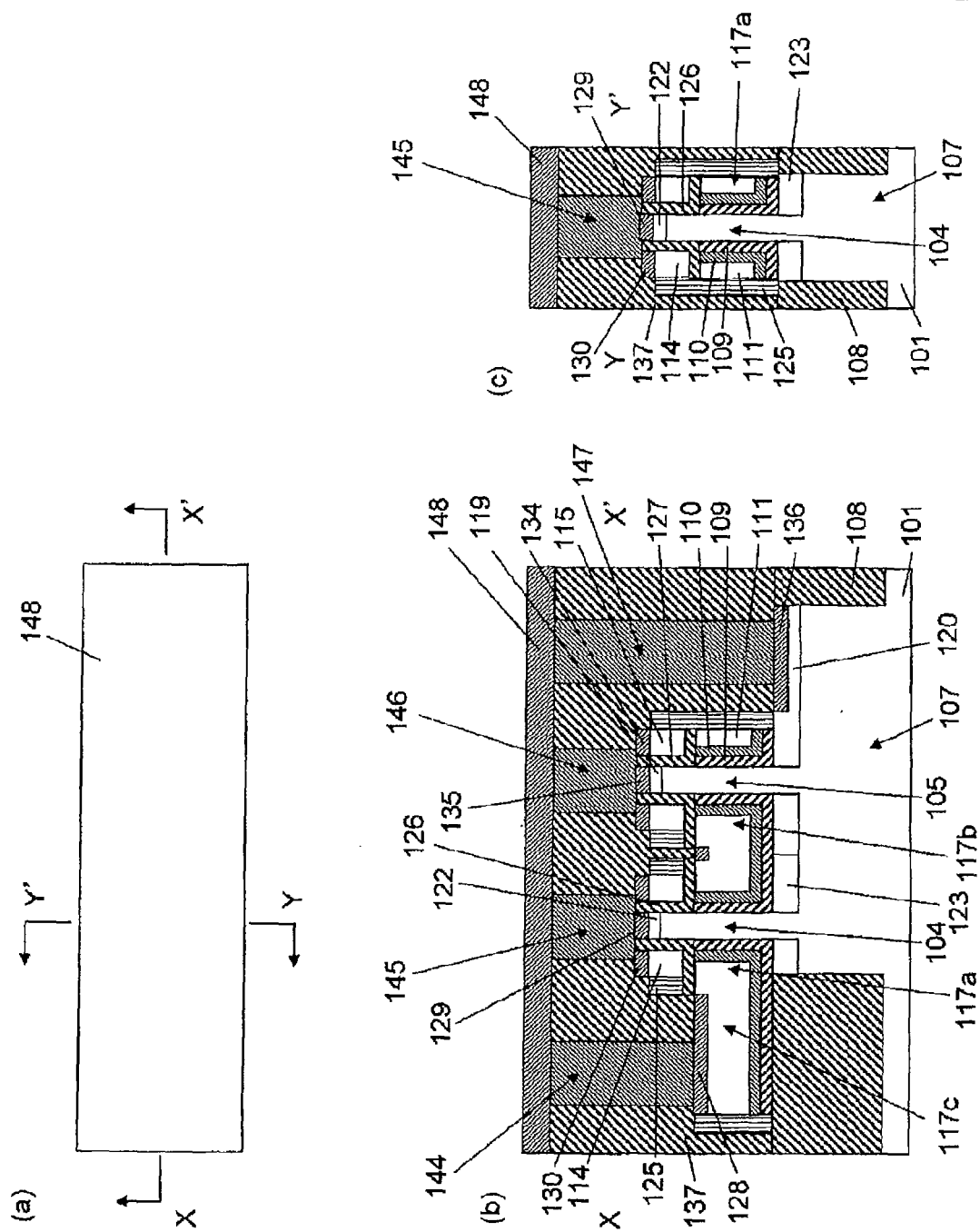
FIG. 40(a) is a plan view of a method for manufacturing a semiconductor device according to an embodiment of the present invention.
FIG. 40(b) is a cross-sectional view taken along line X-X' in FIG. 40(a).
FIG. 40(c) is a cross-sectional view taken along line Y-Y' in FIG. 40(a).

Then, as shown in FIG. 40, a metal 148 is deposited.

Figure 41:
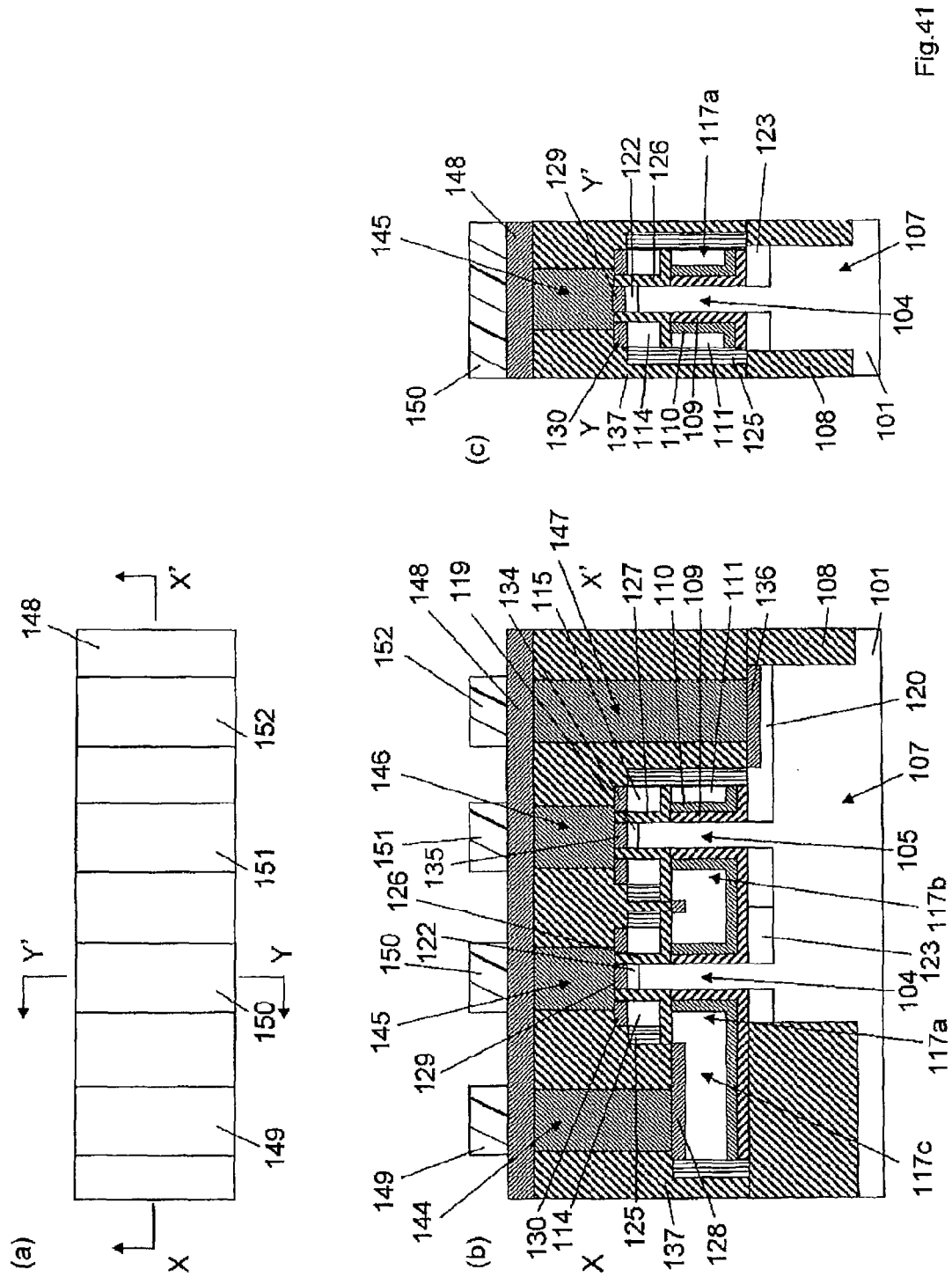
FIG. 41(a) is a plan view of a method for manufacturing a semiconductor device according to an embodiment of the present invention.
FIG. 41(b) is a cross-sectional view taken along line X-X' in FIG. 41(a).
FIG. 41(c) is a cross-sectional view taken along line Y-Y' in FIG. 41(a).

Then, as shown in FIG. 41, eighth resists 149, 150, 151, and 152 are formed for forming metal lines 153, 154, 155, and 156.

Figure 42:
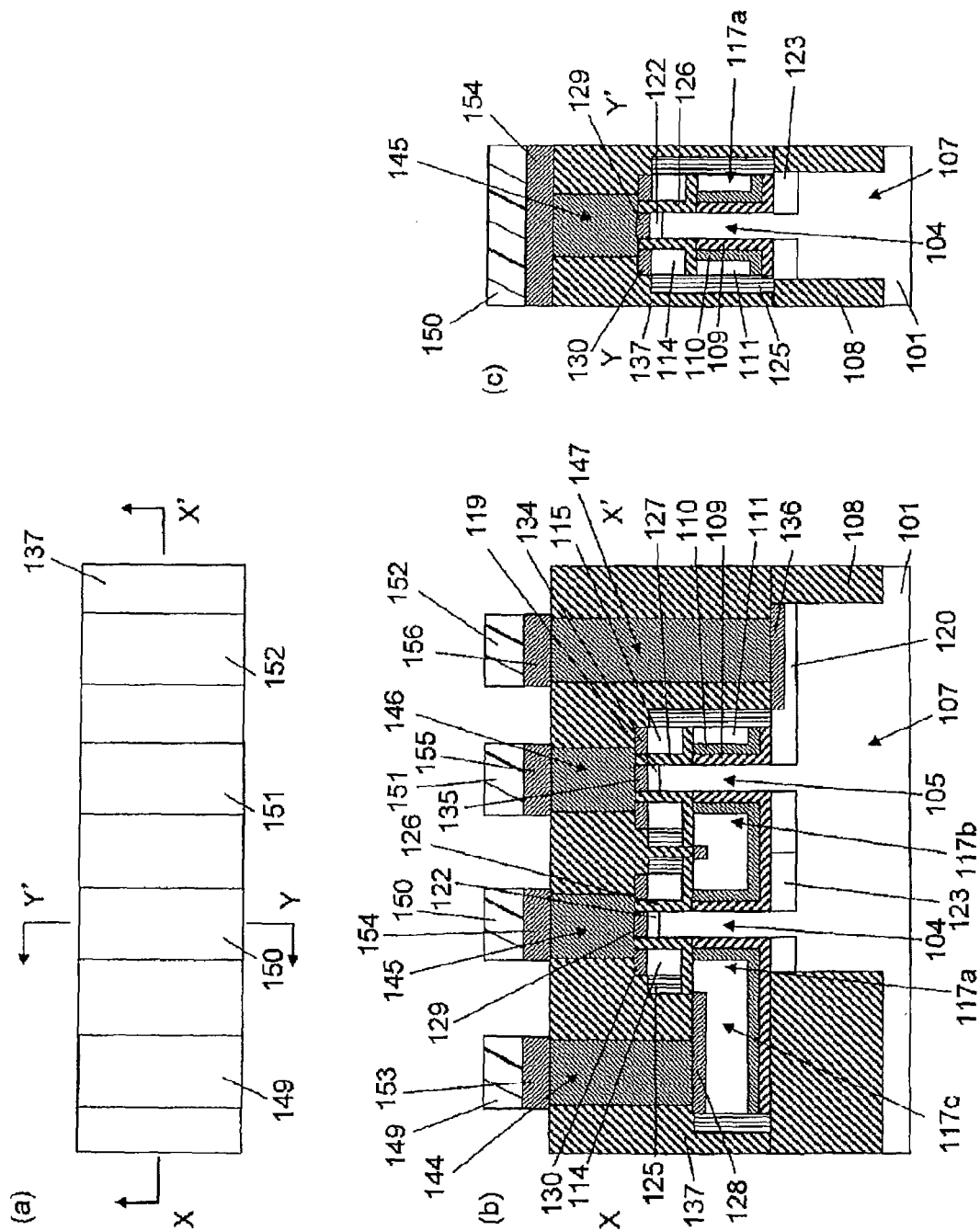
FIG. 42(a) is a plan view of a method for manufacturing a semiconductor device according to an embodiment of the present invention.
FIG. 42(b) is a cross-sectional view taken along line X-X' in FIG. 42(a).
FIG. 42(c) is a cross-sectional view taken along line Y-Y' in FIG. 42(a).

Then, as shown in FIG. 42, the metal 148 is etched to form the metal lines 153, 154, 155, and 156.

Figure 43:
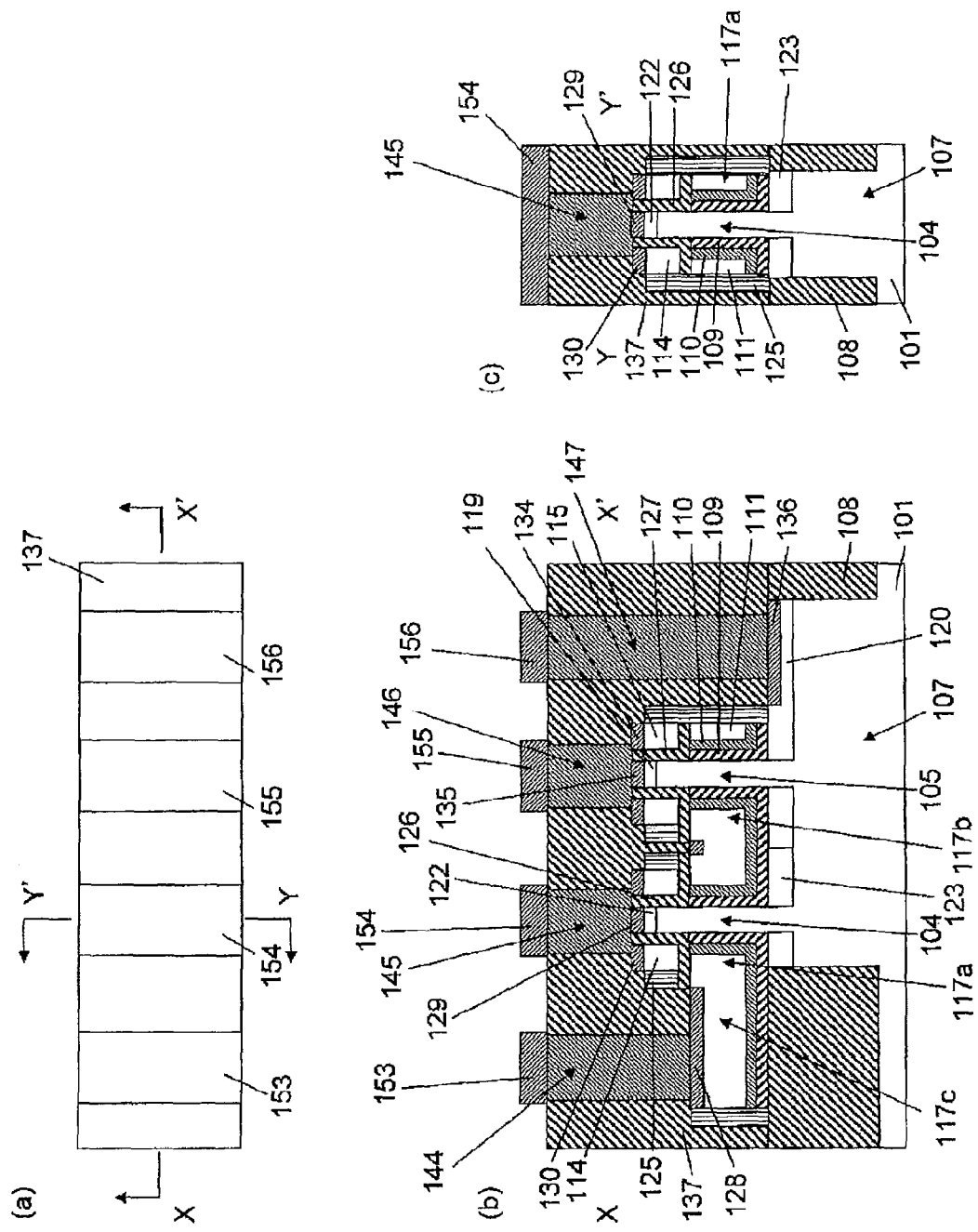
FIG. 43(a) is a plan view of a method for manufacturing a semiconductor device according to an embodiment of the present invention.
FIG. 43(b) is a cross-sectional view taken along line X-X' in FIG. 43(a).
FIG. 43(c) is a cross-sectional view taken along line Y-Y' in FIG. 43(a).

Then, as shown in FIG. 43, the eighth resists 149, 150, 151, and 152 are removed.

What is claimed is:

1. A semiconductor device comprising:
   a planar semiconductor layer on a semiconductor substrate;
   a first pillar-shaped semiconductor layer on the planar semiconductor layer;
   a gate insulating film around the first pillar-shaped semiconductor layer;
   a first gate electrode around the gate insulating film;
   a gate line connected to the first gate electrode;
   a first first-conductivity-type diffusion layer in an upper portion of the first pillar-shaped semiconductor layer;
   a second first-conductivity-type diffusion layer in a lower portion of the first pillar-shaped semiconductor layer and in an upper portion of the planar semiconductor silicon layer;
   a first sidewall having a laminated structure comprising an insulating film and polysilicon, the first sidewall on an upper sidewall of the first pillar-shaped semiconductor layer and on an upper portion of the first gate electrode; and
   a first contact on the first first-conductivity-type diffusion layer and the first sidewall,
   wherein the first contact is connected to the polysilicon of the first sidewall, and the conductivity type of the polysilicon of the first sidewall comprises the first conductivity type.

2. The semiconductor device according to claim 1, further comprising a first silicide on the first first-conductivity-type diffusion layer and on the first sidewall.

3. The semiconductor device according to claim 1, wherein a lower surface of the first first-conductivity-type diffusion layer is higher than an upper surface of the first gate electrode relative to the semiconductor substrate.

4. The semiconductor device according to claim 1, wherein the first gate electrode comprises a laminated structure of a metal and polysilicon.

5. The semiconductor device according to claim 1 further comprising:
   a second pillar-shaped semiconductor layer on the planar semiconductor layer;
   the gate insulating film around the second pillar-shaped semiconductor layer;
   a second gate electrode around the gate insulating film,
   the gate line connected to the second gate electrode;
   a first second-conductivity-type diffusion layer in an upper portion of the second pillar-shaped semiconductor layer;
   a second second-conductivity-type diffusion layer in a lower portion of the second pillar-shaped semiconductor layer and an upper portion of the planar silicon layer;
   a second sidewall having a laminated structure of an insulating film and polysilicon and on an upper sidewall of the second pillar-shaped semiconductor layer and an upper portion of the second gate electrode; and
   a second contact on the first second-conductivity-type diffusion layer and the second sidewall,
   wherein the second contact is connected to the polysilicon of the second sidewall; and
   the conductivity type of the polysilicon of the second sidewall comprises the second conductivity type.

6. The semiconductor device according to claim 5, further comprising a first silicide on the first first-conductivity-type diffusion layer and the first sidewall, and a second silicide on the first second-conductivity-type diffusion layer and the second sidewall.

7. The semiconductor device according to claim 5, wherein a lower surface of the first first-conductivity-type diffusion layer is higher than an upper surface of the first gate electrode relative to the semiconductor substrate, and a lower surface of the first second-conductivity-type diffusion layer is higher than an upper surface of the second gate electrode relative to the semiconductor substrate.

8. The semiconductor device according to claim 5, wherein the first gate electrode comprises a laminated structure of a metal and polysilicon, and the second gate electrode comprises a laminated structure of a metal and polysilicon.

9. The semiconductor device according to claim 1, wherein the first sidewall comprises a deposited insulating film and a deposited polysilicon on the first pillar-shaped semiconductor layer and the sidewall comprises etched polysilicon.

* * * * *